(12) United States Patent
Lembeye et al.

(10) Patent No.: US 9,911,703 B2
(45) Date of Patent: Mar. 6, 2018

(54) OUTPUT IMPEDANCE MATCHING CIRCUIT FOR RF AMPLIFIER DEVICES, AND METHODS OF MANUFACTURE THEREOF

(71) Applicant: Freescale Semiconductor, Inc., Austin, TX (US)

(72) Inventors: Olivier Lembeye, Saint Lys (FR); Damon G. Holmes, Scottsdale, AZ (US); Ning Zhu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/331,115

(22) Filed: Oct. 21, 2016

(65) Prior Publication Data

US 2017/0117239 A1 Apr. 27, 2017

(30) Foreign Application Priority Data

Oct. 21, 2015 (WO) ............... PCT/IB2015/0022047

(51) Int. Cl.
*H03F 3/191* (2006.01)
*H01L 23/66* (2006.01)
(Continued)

(52) U.S. Cl.
CPC ........ *H01L 23/66* (2013.01); *H01L 23/49562* (2013.01); *H01L 23/49589* (2013.01); *H01L 23/528* (2013.01); *H01L 23/5227* (2013.01); *H01L 24/49* (2013.01); *H01L 24/85* (2013.01); *H03F 3/19* (2013.01); *H01L 2223/6655* (2013.01); *H01L 2223/6672* (2013.01); *H01L 2224/48091* (2013.01); *H01L 2224/48106* (2013.01); *H01L 2224/48247* (2013.01); *H01L 2224/48265* (2013.01); *H01L 2224/49052* (2013.01); *H01L 2924/1304* (2013.01); *H01L 2924/19011* (2013.01); *H01L 2924/19041* (2013.01); *H01L 2924/19042* (2013.01); *H01L 2924/19105* (2013.01);
(Continued)

(58) Field of Classification Search
CPC ..... H03F 3/191; H03F 3/193; H03F 2200/387
USPC ......................................... 330/302, 306, 307
See application file for complete search history.

(56) References Cited

U.S. PATENT DOCUMENTS 5,880,517 A * 3/1999 Petrosky ................ H01L 24/49
257/531
7,465,655 B2 12/2008 Brennan et al.
(Continued)

*Primary Examiner* — Steven J Mottola
(74) *Attorney, Agent, or Firm* — Sherry W. Schumm

(57) ABSTRACT

A packaged RF amplifier device includes a transistor and an output circuit. The transistor includes a control terminal and first and second current carrying terminals. The output circuit is coupled between the first current carrying terminal and an output lead. The output circuit includes first and second inductive elements coupled in series. The first inductive element, which may be a first bondwire array or an integrated inductance, is coupled between the first current carrying terminal and a node. The second inductive element, which includes a second bondwire array, is coupled between the node and the output lead. The device also includes a shunt circuit with a shunt capacitor and a third bondwire array coupled between the first current carrying terminal and the shunt capacitor. The first and second inductive elements and the third bondwire array are configured to have a desired mutual inductance.

21 Claims, 12 Drawing Sheets

(51) Int. Cl.
  *H01L 23/00*      (2006.01)
  *H01L 23/495*     (2006.01)
  *H01L 23/522*     (2006.01)
  *H01L 23/528*     (2006.01)
  *H03F 3/19*       (2006.01)

(52) U.S. Cl.
  CPC ............... *H01L 2924/19107* (2013.01); *H03F 2200/387* (2013.01); *H03F 2200/451* (2013.01)

(56) References Cited

U.S. PATENT DOCUMENTS

| | | |
|---|---|---|
| 2008/0246547 A1 | 10/2008 | Blednov |
| 2009/0039986 A1 | 2/2009 | Kamgaing et al. |
| 2012/0194272 A1 | 8/2012 | Keshishian |
| 2014/0027906 A1 | 1/2014 | Narita et al. |
| 2014/0070365 A1 | 3/2014 | Viswanathan et al. |

\* cited by examiner

US 9,911,703 B2

OUTPUT IMPEDANCE MATCHING CIRCUIT FOR RF AMPLIFIER DEVICES, AND METHODS OF MANUFACTURE THEREOF

TECHNICAL FIELD

Embodiments of the subject matter described herein relate generally to packaged semiconductor devices, and more particularly to packaged, radio frequency (RF) semiconductor devices that include output impedance matching circuits.

BACKGROUND

A typical high power, radio frequency (RF) amplifier device may include one or more input leads, one or more output leads, one or more transistors, bondwire arrays coupling the input lead(s) to the transistor(s), and bondwire arrays coupling the transistor(s) to the output lead(s). In some cases, portions of input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead. Essentially, the in-package impedance matching circuits reduce the magnitude of impedance matching that needs to be performed at the printed circuit board (PCB) level, which is a desirable feature of an RF amplifier device. The above-described bondwire arrays have significant inductive reactance at high frequencies, and such inductances may be factored into the design of input and output impedance matching circuits for a device.

A conventional output impedance matching circuit may include one or more capacitive and inductive elements, where the inductive elements may be in the form of bondwire arrays. For example, an output impedance matching circuit may include a series inductance, which is implemented as a "series" bondwire array that is coupled between the transistor's current conducting terminal (e.g., the drain) and the output lead. In addition, the output impedance matching circuit may include a shunt circuit, which includes a shunt inductance to compensate the output capacitance of the transistor, along with a shunt capacitor coupled in series with the shunt inductance. The shunt inductance is implemented as a "shunt" bondwire array, which in this case is coupled between the transistor's current conducting terminal (e.g., the drain) and the shunt capacitor. Unfortunately, positive mutual inductance between the series bondwire array and the shunt bondwire array may significantly degrade the impedance transformation achievable by an output impedance matching circuit.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Embodiments of packaged radio frequency (RF) amplifier devices are described herein, in which the net mutual inductance between series and shunt bondwire arrays in an output impedance matching circuit may be significantly reduced, when compared with conventional output impedance matching circuit configurations. In various embodiments, the series inductance (i.e., the inductance coupled between a current conducting terminal (e.g., the drain) of the device's transistor) is implemented as a "multi-segment" inductance, rather than as a single bondwire array, as is done in a conventional device.

As will be clarified in the description that follows, implementation of the series inductance as a multi-segment inductance enables the net mutual inductance between the series and shunt inductances to be significantly reduced, when compared with a conventional device. In some embodiments, the net mutual inductance may be reduced to near or below net zero inductance (e.g., the net mutual inductance may be negative), which may have significant advantages. For example, reducing the net mutual inductance may result in significant increases in the real part of the output impedance matching that may be achieved within the package (e.g., impedances at or above 1.2 ohms or more). In addition, the multi-segment series inductance of the various embodiments may result in a smaller phase offset between the current carrying terminal and the output lead, which may be particularly advantageous for devices that are used in Doherty and inverted Doherty amplifiers. Further, reducing the net mutual inductance may enable a device to achieve improved performance, when compared with conventional devices, including increased bandwidth at a given power level, increased gain, increased efficiency, improved quality factor (Q) of output impedances, and/or higher power capability within a given power transistor footprint.

Figure 1:
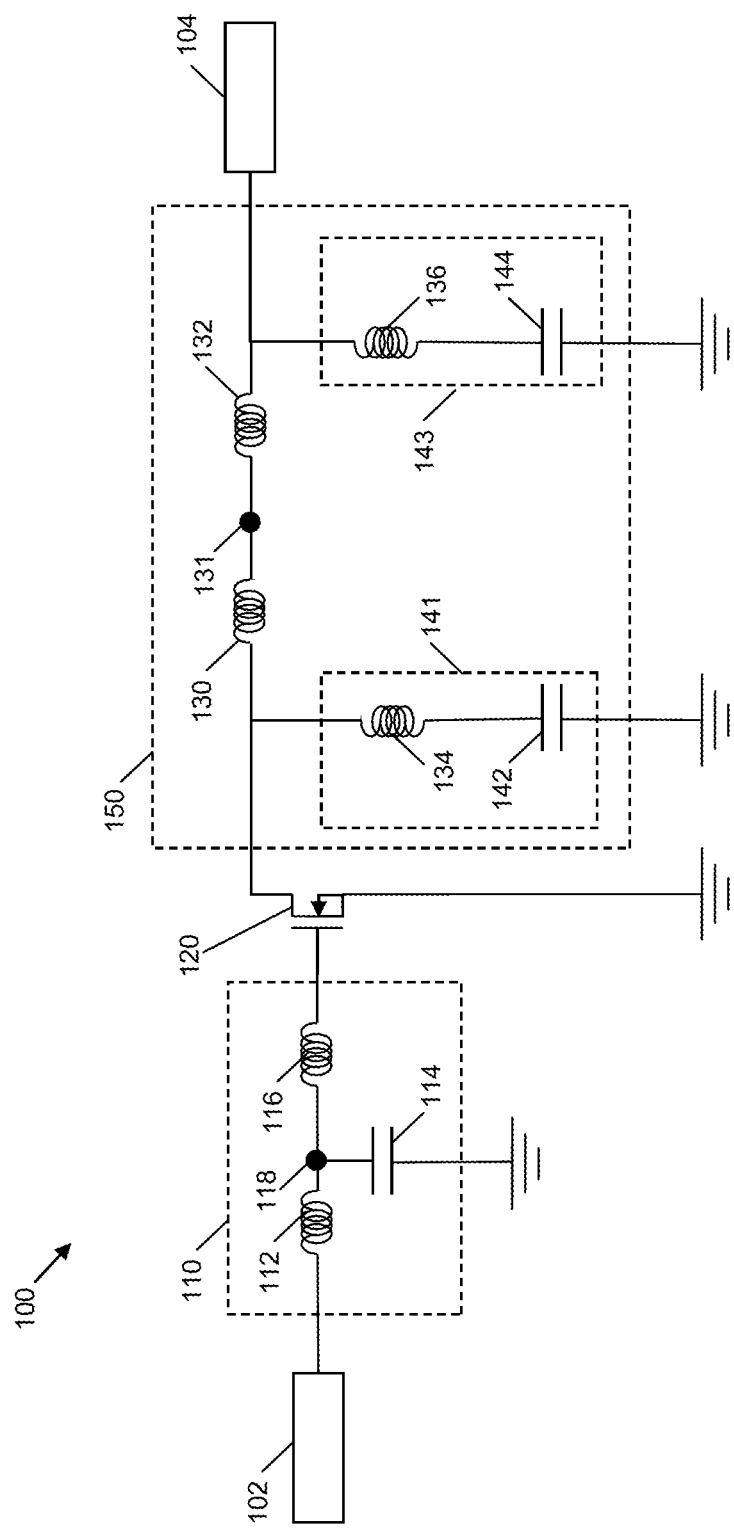
FIG. 1 is a schematic diagram of an RF amplifier device, in accordance with an example embodiment.

FIG. 1 is a schematic diagram of an RF amplifier device 100, in accordance with an embodiment. Essentially, device 100 forms portions of an amplifier, which is configured to increase the power of an RF signal input to the device. The embodiments illustrated herein and described below correspond to a single-stage amplifier, in which a single transistor (e.g., transistor 120) is used to amplify the RF signal. Embodiments of the inventive subject matter also may be applied in multiple-stage (e.g., two-stage) amplifiers, in which a first transistor in a pre-amplifier stage amplifies the input RF signal, and a second amplifier in a main amplifier stage receives and further amplifies the RF signal output from the pre-amplifier stage. For example, the multiple amplifier stages may be implemented on a single transistor die, or the amplifier stages may be implemented on separate die. Although multiple-stage amplifiers are not discussed in detail herein, embodiments of multiple-stage amplifiers are included within the scope of the inventive subject matter.

Device 100 includes an input lead 102, an input circuit 110, a transistor 120, an output circuit 150, and an output lead 104, in an embodiment. Although transistor 120 and various elements of the input and output impedance matching circuits 110, 150 are shown as singular components, the depiction is for the purpose of ease of explanation only. Those of skill in the art would understand, based on the description herein, that transistor 120 and/or certain elements of the input and output circuits 110, 150 each may be implemented as multiple components (e.g., connected in parallel or in series with each other), and examples of such embodiments are illustrated in the other Figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output circuits 110, 150, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input circuit 110 is electrically coupled between the input lead 102 and a first terminal of transistor 120, which is also located within the device's interior, and output circuit 150 is electrically coupled between a second terminal of transistor 120 and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150 and the envelope frequency termination circuit 149, and the source of transistor 120 is coupled to ground (or another voltage reference). Through the variation of control signals provided to the gate of transistor 120, the current between the current conducting terminals of transistor 120 may be modulated.

Input circuit 110 is configured to raise the impedance of device 100 to a higher (e.g., intermediate or higher) impedance level (e.g., in a range from about 2 to about 10 Ohms or higher). Accordingly, input circuit 110 may be considered to be an input impedance matching circuit. Increasing the device impedance is advantageous in that it allows the printed circuit board level (PCB level) matching interface from a driver stage to have an impedance that can be achieved in high-volume manufacturing with minimal loss and variation (e.g., a "user friendly" matching interface).

Input circuit 110 is coupled between the input lead 102 and the control terminal (e.g., gate) of the transistor 120. According to an embodiment, input circuit 110 includes two inductive elements 112, 116 (e.g., two bondwire arrays) and a shunt capacitor 114. A first inductive element 112 (e.g., a first bondwire array) is coupled between input lead 102 and a first terminal of capacitor 114 (at node 118), and a second inductive element 116 (e.g., a second bondwire array) is coupled between the first terminal of capacitor 114 and the control terminal of transistor 120. The second terminal of capacitor 114 is coupled to ground (or another voltage reference). The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 5 picofarads (pF) to about 80 pF.

Output circuit 150 is configured to match the output impedance of device 100 with the input impedance of an external circuit or component (not shown) that may be coupled to output lead 104. More specifically, output circuit 150 provides a portion of an impedance match between the transistor 120 and a load (not illustrated) to which the device 100 is coupled. Accordingly, output circuit 150 may be considered to be an output impedance matching circuit (or an output impedance "pre-match" circuit, where a remainder of the impedance matching is performed at the PCB level). Output circuit 150 is coupled between the first current conducting terminal (e.g., drain) of transistor 120 and the output lead 104. According to an embodiment, output circuit 150 includes a series circuit coupled between the first current conducting terminal of transistor 120 and the output lead 104, and two shunt circuits, where one shunt circuit is coupled between the first current conducting terminal and a ground reference, and the second shunt circuit is coupled between the output lead 104 and the ground reference. All-in-all, the series circuit and the two shunt circuits includes four inductive elements 130, 132, 134, 136 (also referred to as "inductors," herein) and two capacitors 142, 144, in an embodiment.

The series circuit includes a multi-segment inductance, in an embodiment, and thus may be referred to as a "multi-segment series inductance circuit" herein. More specifically, the series circuit includes first and second inductive elements 130, 132 (also referred to herein as "series inductive elements") series-coupled between the first current conducting terminal (e.g., drain) of transistor 120 and the output lead 104, according to an embodiment. Each of the first and second inductive elements 130, 132 may be considered a "segment" of the multi-segment inductance. A first terminal of first inductive element 130 is coupled to the first current conducting terminal of transistor 120, a second terminal of first inductive element 130 is coupled (at node 131) to a first terminal of second inductive element 132, and a second terminal of second inductive element 132 is coupled to the output lead 104, in an embodiment. As will be described in more detail below, the first inductive element 130 may be implemented as a plurality of parallel-coupled bondwires (e.g., bondwires 230, FIG. 2). Alternatively, in another embodiment, the first inductive element 130 may include one or more conductive traces (e.g., integrated traces 530, 630, FIGS. 5, 6). In still another alternate embodiment, the first inductive element 130 may include one or more integrated inductors (e.g., integrated spiral inductors 830, FIG. 8). According to an embodiment, the series combination of inductive elements 130, 132 may have an inductance value in a range between about 100 pH to about 5000 pH. For example, inductive element 130 may have an inductance value in a range between about 25 pH to about 300 pH, and inductive element 132 may have an inductance value in a range between about 100 pH to about 900 pH. In other embodiments, the series combination of inductive elements 130, 132 and/or each inductive element 130, 132 individually may have inductances that are less than or greater than the above-given ranges.

The first shunt circuit includes a third inductive element 134 and a first capacitor 142, in an embodiment. The third inductive element 134 is coupled between the first current conducting terminal of transistor 120 and a first terminal of the first capacitor 142. A second terminal of the first capacitor 142 is coupled to ground (or to another voltage reference), in an embodiment. The series-coupled combination of the third inductive element 134 and the first capacitor 142 functions as a first (high-pass) matching stage. Accordingly, the combination of inductive element 134 and capacitor 142 may be referred to herein as a high-pass matching circuit 141. According to an embodiment inductive element 134 may have a value in a range between about 100 pH to about 5000 pH, and capacitor 142 may have a value in a range between about 50 pF to about 500 pF, although these components may have values outside of these ranges, as well.

An RF "cold point" is present at a node between inductive element 134 and capacitor 142, where the RF cold point represents a high baseband impedance and low RF impedance point in the circuit. Although not illustrated in FIG. 1, an envelope frequency termination circuit may be coupled between the RF cold point node and ground (or another voltage reference). For example, the envelope frequency termination circuit may include an inductance, a resistor, and a capacitor coupled in series.

The second shunt circuit includes a fourth inductive element 136 and a second capacitor 144, in an embodiment. The fourth inductive element 136 is coupled between the output lead 104 and a first terminal of the second capacitor 144. A second terminal of the second capacitor 144 is coupled to ground (or to another voltage reference), in an embodiment. The series-coupled combination of the fourth inductive element 136 and the second capacitor 144 functions as a second (low-pass) matching stage. Accordingly, the combination of inductive element 136 and capacitor 144 may be referred to herein as a low-pass matching circuit 143. According to an embodiment inductive element 136 may have a value in a range between about 50 pH to about 1 nH, and 1 capacitor 144 may have a value in a range between about 1 pF to about 50 pF, although these components may have values outside of these ranges, as well. According to an alternate embodiment, low pass matching circuit 143 may be excluded altogether from device 100.

Figure 2:
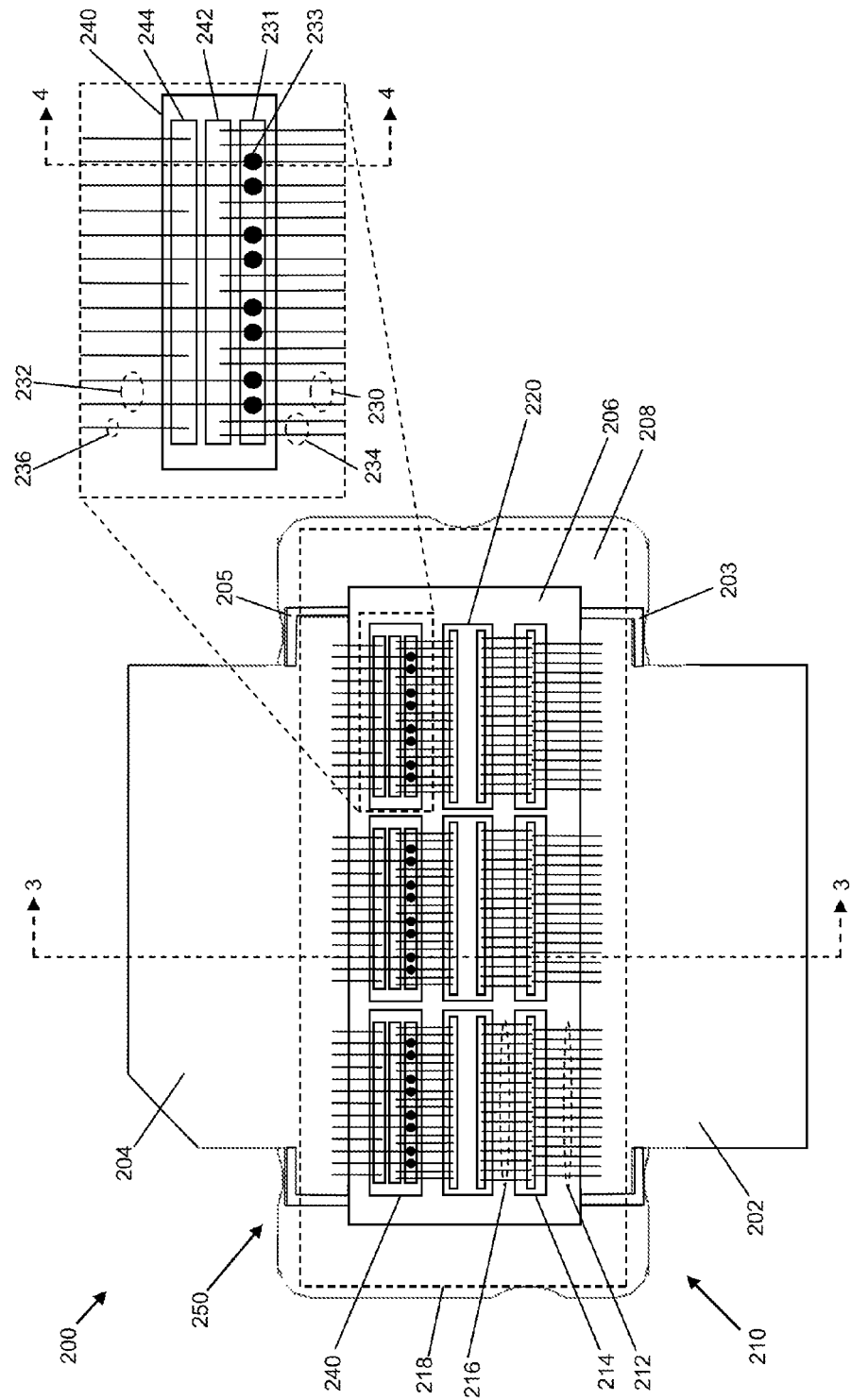
FIG. 2 is a top view of an example of a packaged RF amplifier device that embodies the circuit of FIG. 1, in accordance with an example embodiment.
Figure 3:
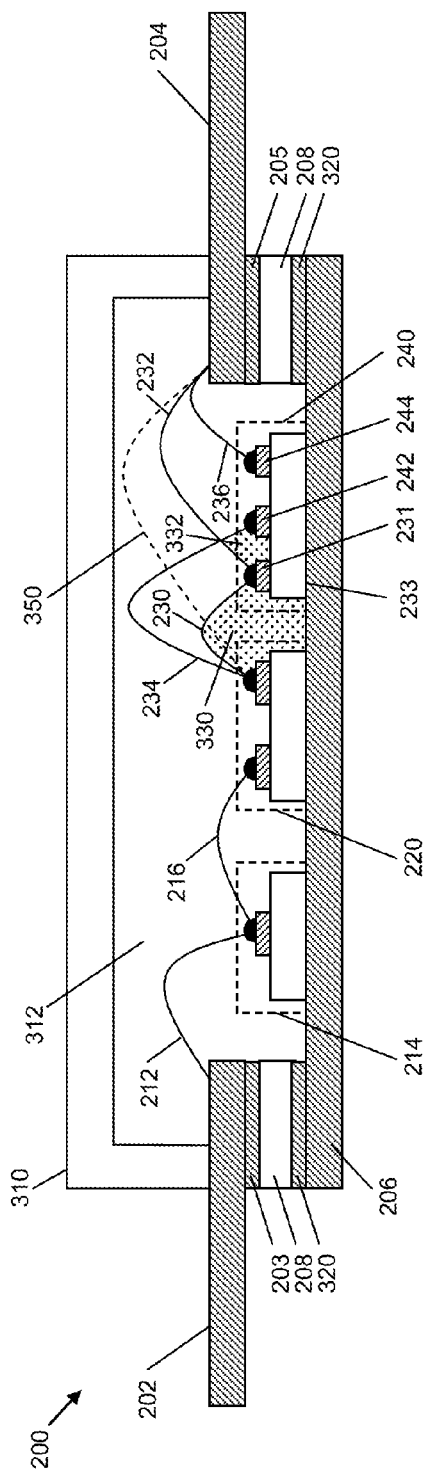
FIG. 3 is a cross-sectional, side view of the RF amplifier device of FIG. 2 along line 3-3.

FIG. 2 is a top view of an example of a packaged RF amplifier device 200 that embodies the circuit of FIG. 1, in accordance with an embodiment, and where a portion of the amplifier device 200 is shown enlarged on the right side of FIG. 2. More particularly, the interconnected electrical components and elements of device 200 may be modeled by the schematic diagram of FIG. 1. For enhanced understanding, FIG. 2 should be viewed in conjunction with FIG. 3, which is a cross-sectional, side view of the semiconductor device 200 of FIG. 2 along line 3-3. More specifically, FIG. 3 is a cross-sectional view through input and output leads 202, 204 and the active device area. FIG. 3 also illustrates a cap 310, which may be implemented in air cavity package embodiments to seal the interior components of device 200 within an air cavity 312.

Device 200 includes an input lead 202 (e.g., input lead 102, FIG. 1), an output lead 204 (e.g., output lead 104, FIG. 1), a flange 206, an isolation structure 208, a plurality of transistors 220 (e.g., transistor 120, FIG. 1), an input circuit 210 (e.g., input circuit 110, FIG. 1), and an output circuit 250 (e.g., output circuit 150, FIG. 1), all of which may be packaged together as parts of the device 200. In the example of FIG. 2, device 200 includes three transistors 220 that essentially function in parallel, although another semiconductor device may include one or two transistors or more than three transistors, as well. In addition, device 200 includes three input capacitors 214 and three IPDs 240, which also essentially function in parallel. It is to be understood that more or fewer of capacitors 214 and/or IPDs 240 may be implemented, as well. For purposes of clarity, transistors 220, input capacitors 214, and IPDs 240 each may be referred to in the singular sense, below, as will analogous components in other, later-described Figures. It is to be understood that the description of a particular device component in the singular sense applies to the set of all such components. According to an embodiment, jumper wires (not illustrated) may be electrically coupled between the multiple transistors 220, input capacitors 214, and IPDs 240, in order to provide low frequency paths between corresponding components.

According to an embodiment, device 200 is incorporated in an air cavity package, in which transistors 220 and various input and output circuit elements 212, 214, 216, 230, 232, 234, 236, and 240 are located within an enclosed air cavity 312. Basically, the air cavity is bounded by flange 206, isolation structure 208, and a cap 310 overlying and in contact with the isolation structure 208 and leads 202, 204. In FIG. 2, an example perimeter of the cap 310 is indicated by dashed box 218. In other embodiments, a device may be incorporated into an overmolded package (i.e., a package in which the electrical components within the active device area are encapsulated with a non-conductive molding compound, and in which portions of the leads 202, 204, and all or portions of the isolation structure 208 also may be encompassed by the molding compound).

Flange 206 includes a rigid electrically-conductive substrate, which has a thickness that is sufficient to provide structural support for electrical components and elements of device 200. In addition, flange 206 may function as a heat sink for transistors 220 and other devices mounted on flange 206. Flange 206 has a top and bottom surface (only a central portion of the top surface is visible in FIG. 2), and a substantially-rectangular perimeter that corresponds to the perimeter of the device 200 (e.g., to the perimeter of isolation structure 208, described below).

Flange 206 is formed from a conductive material, and may be used to provide a ground reference for the device 200. For example, various components and elements may have terminals that are electrically coupled to flange 206, and flange 206 may be electrically coupled to a system ground when the device 200 is incorporated into a larger electrical system. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. Flange 206 may more generally be referred to as a substrate with a conductive surface.

Isolation structure 208 is attached to the top surface of flange 206. For example, isolation structure 208 may include a layer of metallization 320 on its bottom surface, which may be soldered to or otherwise attached to the top surface of flange 206. Isolation structure 208 is formed from a rigid, electrically insulating material (i.e., a material with a dielectric constant in a range from about 3.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 202, 204 and flange 206). For example, isolation structure 208 may be formed from inorganic materials (e.g., ceramic such as aluminum oxide, aluminum nitride, and so on) and/or organic materials (e.g., one or more polymers or printed circuit board (PCB) materials). In an embodiment in which isolation structure 208 comprises PCB materials (e.g., the isolation structure 208 essentially includes a single or multi-layer PCB), conductive layers (e.g., copper layers) may be included on the top and bottom surfaces of the isolation structure. In a further embodiment, a conductive layer on the top surface of the isolation structure 208 may be patterned and etched to form a leadframe (including leads 202, 204) for the device 200, and a conductive layer on the bottom surface of the isolation structure 208 may be coupled to the flange 206. In other embodiments, conductive layers may be excluded from the top and/or bottom surface of the isolation structure 208. In such embodiments, leads (e.g., leads 202, 204) may be coupled to the isolation structure 208 using epoxy (or other adhesive materials), and/or the isolation structure 208 may be coupled to the flange 206 using epoxy (or other adhesive materials). In still other embodiments, the isolation structure 208 may be milled at the portion of its top surface to which a lead is attached.

Isolation structure 208 has a frame shape, in an embodiment, which includes a substantially enclosed, four-sided structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. For example, in an alternate embodiment, isolation structure 208 may include multiple portions that contact each other or that are spatially separated from each other (e.g., isolation structure 208 may have one portion isolating input lead 202 from flange 206, and another portion isolating output lead 204 from flange 206).

The input and output leads 202, 204 are mounted on a top surface of the isolation structure 208 on opposed sides of the central opening, and thus the input and output leads 202, 204 are elevated above the top surface of the flange 206, and are electrically isolated from the flange 206. For example, the input and output leads 202, 204 may be soldered or otherwise attached to metallization 203, 205 on a top surface of isolation structure 208. The metallization 203, 205 may be considered to be conductive pads to which the input and output leads 202, 204 are coupled. Generally, the input and output leads 202, 204 are oriented in order to allow for attachment of bondwires (e.g., bondwires 212, 232, 236) between the input and output leads 202, 204 and components and elements within the central opening of isolation structure 208.

Transistors 220 and various elements 214, 240 of the input and output circuits 210, 250 are mounted on a generally central portion of the top surface of a flange 206 that is exposed through the opening in isolation structure 208. As used herein, an "active device area" corresponds to a portion of a device on which one or more active devices (e.g., transistors 220) are mounted (e.g., the portion of the conductive surface of flange 206 that is exposed through the opening in isolation structure 208). According to an embodiment, transistors 220 are positioned within the active device area of device 200, along with impedance matching elements 214, 240. For example, the transistors 220, capacitors 214, and IPDs 240 may be coupled to flange 206 using conductive epoxy, solder, solder bumps, sintering, and/or eutectic bonds.

Each transistor 220 has a control terminal (e.g., a gate) and two current conducting terminals (e.g., a drain and a source). Conductive landing pads (not numbered) at the top surface of each transistor 220 are electrically coupled to the control terminals and to one of the current conducting terminals of each transistor 220, respectively. The control terminal of each transistor 220 is coupled to the input lead 202 through the input circuit 210 (e.g., through bondwires 212 and bondwires 216 of the input circuit 210). In addition, one current conducting terminal (e.g., the drain) is coupled to the output lead 204 through output circuit 250 (e.g., through bondwires 230, 232 of the output circuit 250). The other current conducting terminal (e.g., the source) is coupled to the flange 206 (e.g., to ground), in an embodiment.

The input circuit 210 (e.g., input circuit 110, FIG. 1) is coupled between the input lead 202 (e.g., input lead 102, FIG. 1) and the control terminal of the transistor 220 (e.g., transistor 120, FIG. 1). In the device 200 of FIG. 2, the input circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced bondwires (referred to as a "bondwire array," herein), in an embodiment. For example, a first inductive element 212 (e.g., inductive element 112, FIG. 1) includes a plurality of bondwires coupled between input lead 202 and a first terminal of capacitor 214 (e.g., a first terminal of capacitor 114, FIG. 1). A second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor, a discrete ceramic capacitor, or another type of capacitor. First ends of bondwires 212, 216 are attached to a conductive landing pad (not numbered, but corresponding to node 118, FIG. 1) at the top surface of capacitor 214, which in turn is electrically coupled to the first terminal of capacitor 214. Further, second ends of bondwires 216 are attached to the conductive landing pad (not numbered) at the top surface of transistor 220, which in turn is electrically coupled to the control terminal of transistor 220.

The output circuit 250 (e.g., output impedance matching circuit 150, FIG. 1) is coupled between a first current conducting terminal (e.g., drain) of transistor 220 (e.g., transistor 120, FIG. 1) and the output lead 204 (e.g., output lead 104, FIG. 1). In the device 200 of FIG. 2, the output circuit 250 includes four inductive elements 230, 232, 234, 236 (e.g., inductive elements 130, 132, 134, 136, FIG. 1) and two capacitors 442, 444 (e.g., capacitors 142, 144, FIG. 1).

Figure 4:
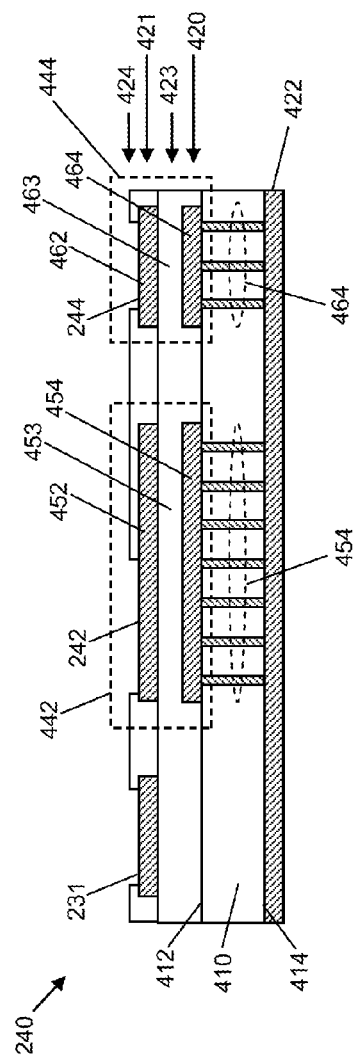
FIG. 4 is a cross-sectional, side view of the integrated passive device (IPD) of FIG. 2 along line 4-4.

The capacitors 442, 444 (e.g., capacitors 142, 144, FIG. 1) of output circuit 250 are included in IPD 240, according to an embodiment. More particularly, in an embodiment, shunt capacitor 442 and low-pass matching capacitor 444 are integrally formed in IPD 240. Referring also to FIG. 4, which is a cross-sectional view of IPD 240 along line 4-4 of FIG. 2, IPD 240 includes a semiconductor substrate 410 and a plurality of conductive layers 420, 421 and dielectric layers 423, 424 built up on a top surface 412 of the substrate 410. The semiconductor substrate 410 may be formed from any of a variety of semiconductor materials, including but not limited to silicon, gallium arsenide, gallium nitride, and so on. In addition, IPD 240 includes a conductive layer 422 may be formed on a bottom surface 414 of IPD 240. As will be discussed in more detail below, IPD 240 also includes a plurality of conductive landing pads 231, 242, 244 exposed at its top surface. According to an embodiment, each landing pad 231, 242, 244 is configured to accept attachment of one or more bondwires (e.g., bondwires 230, 232, 234, 236).

According to an embodiment, shunt capacitor 442 and low-pass matching capacitor 444 each are implemented as metal-insulator-metal (MIM) capacitors (e.g., with parallel metal plates electrically separated by a thin dielectric (e.g., a thin nitride or oxide). More specifically, shunt capacitor 442 (e.g., shunt capacitor 142, FIG. 1) includes a first terminal 452 and a second terminal 454 that are separated by dielectric material 453. Similarly, low-pass matching capacitor 444 (e.g., low-pass matching capacitor 144, FIG. 1) includes a first terminal 462 and a second terminal 464 that are separated by dielectric material 463. In an embodiment in which low-pass matching circuit 143 is excluded, IPD 240 may exclude capacitor 444 (e.g., capacitor 144, FIG. 1).

Each inductive element 230, 232, 234, 236 is formed from a plurality of parallel, closely-spaced bondwires, in an embodiment. For example, a first series inductive element 230 (e.g., series inductive element 130, FIG. 1) includes a plurality of bondwires coupled between the first current conducting terminal (e.g., the drain) of transistor 220 and a node, which in the illustrated embodiment is implemented as a first conductive landing pad 231 that is exposed at the top surface of IPD 240. A second series inductive element 232 (e.g., series inductive element 132, FIG. 1) includes a plurality of bondwires coupled between node (or landing pad 231) and the output lead 204. Essentially, inductive elements 230, 232 are coupled in series between the first current conducting terminal of transistor 220 and the output lead 204. For example, each series combination of inductive elements 230, 232 may be a single bondwire with a tack point 233 at landing pad 231. Alternatively, each of inductive elements 230, 232 may be separate bondwires that are coupled to landing pad 231. According to an embodiment, the bondwires of the series inductive element 230 have a height, above the top surface of substrate 206, in a range of about 10 mils to about 20 mils, and the bondwires of the series inductive element 232 have a height, above the top surface of substrate 206, in a range of about 20 mils to about 60 mils, although the heights could be smaller or greater.

The first and second series inductive elements 230, 232 correspond to distinct segments of a two-segment series inductance. The first and second series inductive elements 230, 232 are "distinct" inductive segments in that they each have first and second ends that are electrically coupled to different sets of conductive features. For example, in the embodiment of FIG. 2, each of the first series inductive elements 230 is electrically coupled between a first current conducting terminal of a transistor 220 and a node 231 (i.e., first or "proximal" ends of the bondwires 230 are coupled to transistor 220, and second or "distal" ends are coupled to node 231), and the second series inductive elements 232 are distinct from the first series inductive elements 230 because the second series inductive elements 232 are electrically coupled between the node 231 and the output lead 204 (i.e., first or "proximal" ends of the bondwires 232 are coupled to the node 231, and second or "distal" ends are coupled to the output lead 204). Even though the first and second series inductive elements 230, 232 may be formed from a single bondwire that is tacked to node 231, in an embodiment, the first and second series inductive elements 230, 232 still are considered to be "distinct," according to the above definition.

A shunt inductive element 234 (e.g., shunt inductive element 134, FIG. 1) includes a plurality of bondwires coupled between the first current conducting terminal of transistor 220 and a second conductive landing pad 242 that is exposed at the top surface of the IPD 240 (i.e., first or "proximal" ends of the bondwires 234 are coupled to transistor 220, and second or "distal" ends are coupled to landing pad 242). Landing pad 242 corresponds to the RF cold point of the device, in an embodiment. According to an embodiment, the bondwires of the shunt inductive element 234 have a height, above the top surface of substrate 206, in a range of about 20 mils to about 60 mils, although the heights could be smaller or greater. In the embodiment shown in FIG. 2, the height of the bondwires of the shunt inductive element 234 is significantly greater than the height of the bondwires of the series inductive element 230. Further, the height of the bondwires of the shunt inductive element 234 is significantly greater than the height of the bondwires of the series inductive element 232. In alternate embodiments, the height of the bondwires of the shunt inductive element 234 may be substantially equal to or less than the height of the bondwires of the series inductive element 232.

In addition, in FIG. 2, the first conductive landing pad 231 (i.e., the pad 231 to which bondwires 230, 232 are attached) is closer to the transistor 220 than the second conductive landing pad 242 (i.e., the pad 242 to which bondwires 234 are attached). More specifically, the conductive landing pad 231 is positioned (in the horizontal direction in FIG. 3) between the highest point of bondwires 234 and landing pad 242. In alternate embodiments, the first and second conductive landing pads 231, 242 could be equidistant from the transistor 220 (e.g., they could be interleaved and side-by-side in IPD 240), or the second conductive landing pad 242 could be closer to the transistor 220 than the first conductive landing pad 231 (e.g., they could be switched in position in IPD 240).

Within IPD 240, the conductive landing pad 242 is electrically coupled to the first terminal 452 of shunt capacitor 442. In FIG. 4, the first terminal 452 of shunt capacitor 442 is shown to be formed from the same conductive layer 421 as landing pad 242, although the first terminal 452 and landing pad 242 may be formed from portions of different layers. The second terminal 454 of capacitor 442 is electrically coupled to the conductive layer 422 on the bottom surface 414 of IPD 240 with conductive through substrate vias (TSVs) 454.

A low-pass matching inductive element 236 (e.g., low-pass matching inductive element 136, FIG. 1) includes a plurality of bondwires coupled between the output lead 204 and a third conductive landing pad 244 that is exposed at the top surface of the IPD 240. Within IPD 240, the conductive landing pad 244 is electrically coupled to the first terminal 462 of low-pass matching capacitor 444. In FIG. 4, the first terminal 462 of low-pass matching capacitor 444 is shown to be formed from the same conductive layer 421 as landing pad 244, although the first terminal 462 and landing pad 244 may be formed from portions of different layers. The second terminal 464 of capacitor 444 is electrically coupled to the conductive layer 422 on the bottom surface 414 of IPD 240 with conductive TSVs 464.

Referring again to FIG. 3, and as will be explained in more detail later in conjunction with FIGS. 12-14, it is notable that the net inductive coupling between series-coupled bondwires 230, 232 and bondwires 234 is related to the size of the common areas 330, 332 (indicated with shading) below the bondwire arrays 230, 232, 234. The size of the common areas 330, 332, in turn, is related to the relative heights and shapes of bondwires 230, 232, 234, and the horizontal separation between the distal ends of bondwires 230 and 234. Both positive and negative inductive coupling may be present, and a summation of the positive inductive coupling and the negative inductive coupling reflects the "net" inductive coupling between the bondwire arrays 230, 232, 234.

In a conventional device, to provide the series inductance between the transistor and the output lead, a single bondwire array 350 (indicated with a dashed line to make it clear that bondwire array 350 relates to a conventional implementation, and is not actually included in device 200) extending directly from the transistor to the output lead is used, rather than using the series-coupled bondwires 230, 232 of the embodiment of FIGS. 1 and 2. In proximity to the shunt bondwires (e.g., bondwires 234), the bondwires of a conventional series bondwire array 350 may have a significantly higher average height than bondwires 230. Accordingly, the common area below the conventional series and shunt bondwire arrays may be significantly larger than the common area 330, 332 below bondwire array 230, 234. It is desirable to minimize the net inductive coupling between the series and shunt bondwires in an output circuit, and by reducing the size of the common area 330, the various embodiments also may significantly reduce the net inductive coupling between the series and shunt bondwires 230, 234. Further, the positions of landing pads 231, 242 with respect to the transistor 220 also may affect the net inductive coupling between the series and shunt bondwire arrays, as will be explained in more detail later. In some embodiments, negative inductive coupling may be larger than the positive inductive coupling, leading to a negative net inductive coupling between the series and shunt inductances. To summarize, the net inductive coupling between bondwire arrays 230, 232, 234 may be positive, near zero, or negative, depending on various factors.

In the embodiment of FIGS. 1 and 2, reduction in the net inductive coupling between the series and shunt bondwires is achieved by dividing the series bondwire into multiple distinct bondwire segments (e.g., separate bondwires 230, 232 or a single bondwire that is tacked down at a physical location (e.g., node 231) that is between the transistor 220 and the output lead 204). In alternate embodiments, the net inductive coupling may be further reduced in other ways. For example, in the embodiments illustrated in FIGS. 5-11, discussed below, the net inductive coupling is reduced by integrating a portion of the series inductance into the transistor die. More specifically, the first segment in the series inductance is integrated into the transistor die, which results in the first segment having a significantly reduced height (e.g., a height approximately equal to or less than the height of the transistor die). In this manner, the positive inductive coupling between the first segment of the series inductance and the shunt bondwire array may be reduced even more.

Figure 5:
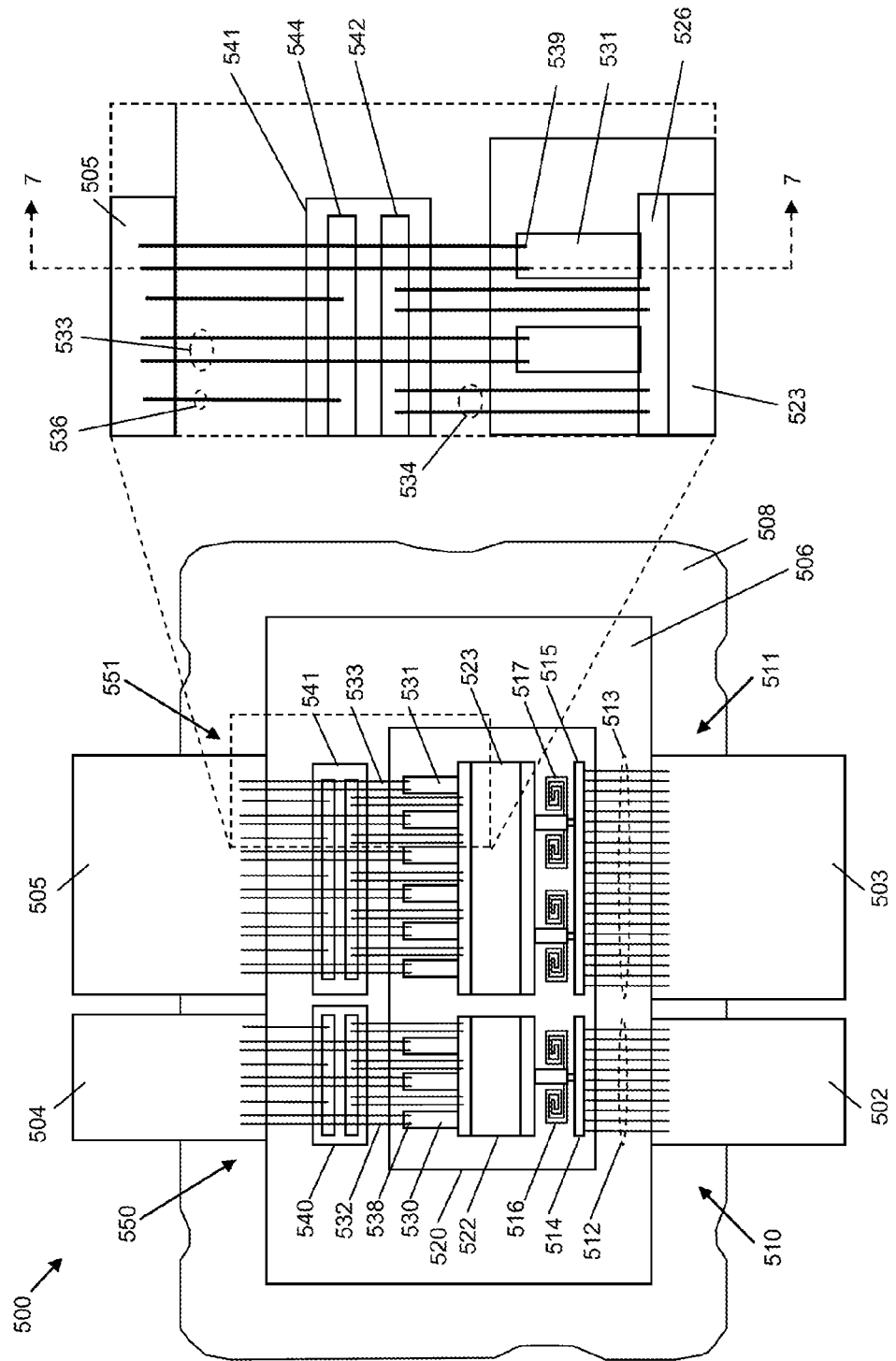
FIG. 5 is a top view of an example of a packaged RF amplifier device that embodies the circuit of FIG. 1, in accordance with another example embodiment.
Figure 7:
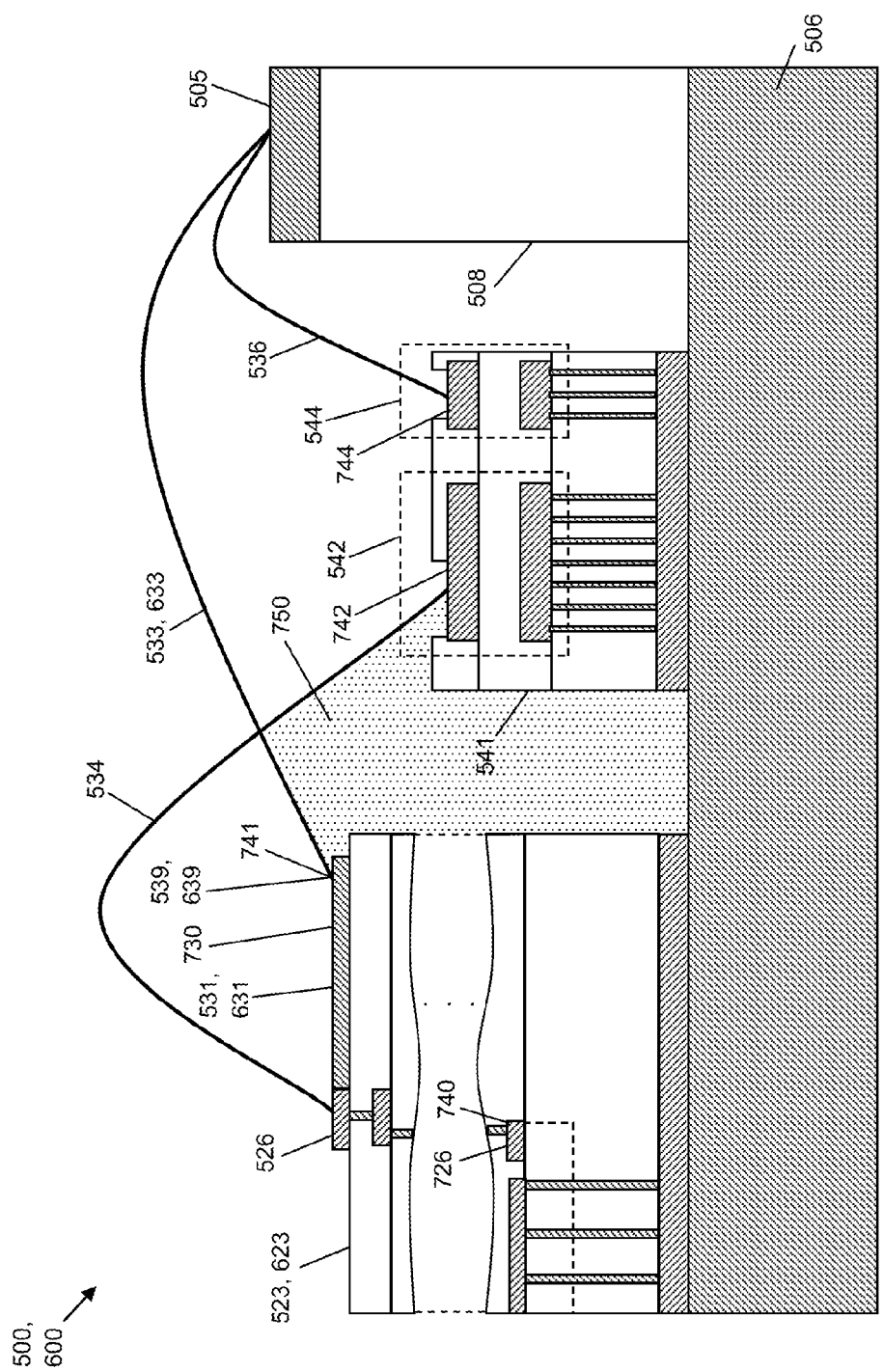
FIG. 7 is a cross-sectional, side view of the RF amplifier device of FIG. 5 or FIG. 6 along line 7-7.

FIG. 5 is a top view of an example of a packaged RF amplifier device 500 that embodies the circuit of FIG. 1, in accordance with another example embodiment, and where a portion of the amplifier device 500 is shown enlarged on the right side of FIG. 5. For enhanced understanding, FIG. 5 should be viewed in conjunction with FIG. 7, which is a cross-sectional, side view of the semiconductor device 500 of FIG. 5 along line 7-7. More specifically, FIG. 7 is a cross-sectional view through a portion of transistor die 520, IPD 541, and output lead 505. Some of the features of device 500 are substantially similar to corresponding features of the device 200 of FIG. 2. For brevity, where similarities exist, the features are not discussed in detail. Unless specified to the contrary, the details of various features discussed above are intended to be incorporated into the description of corresponding features discussed below.

Device 500 includes two separate amplification paths, and accordingly includes two input leads 502, 503 (e.g., two instances of input lead 102, FIG. 1), and two output leads 504, 505 (e.g., two instances of output lead 104, FIG. 1). Device 500 also includes a flange 506, an isolation structure 508, a transistor die 520 with two transistors 522, 523 (e.g., two instances of transistor 120, FIG. 1), two input circuits 510, 511 (e.g., two instances of input circuit 110, FIG. 1), and two output circuits 550, 551 (e.g., two instances of output circuit 150, FIG. 1), all of which may be packaged together as parts of the device 500. As will be discussed below, portions of the input circuits 510, 511 and portions of the output circuits 550, 551 are integrated within the transistor die 520. In addition, other portions of the output circuits 550, 551 are included in IPDs 540, 541. Although only one transistor die 520 is illustrated in FIG. 5, it is to be understood that more transistor dies 520 may be implemented, as well. Further, although two IPDs 540, 541 are illustrated in FIG. 5, it is to be understood that more or fewer IPDs 540, 541 may be implemented.

According to an embodiment, device 500 is incorporated in an air cavity package, in which transistor die 520 and various input and output circuit elements are located within an enclosed air cavity. In other embodiments, device 500 may be incorporated into an overmolded package.

Electrically insulating isolation structure 508 is attached to the top surface of flange 506, which has a conductive top surface. The input and output leads 502-505 are mounted on a top surface of the isolation structure 508 on opposed sides of a central opening, through which a portion of flange 506 is exposed. Transistor die 520 and IPDs 540, 541 are mounted on a generally central portion of the top surface of a flange 506 that is exposed through the opening in isolation structure 508. For example, the transistor die 520 and IPDs 540, 541 may be coupled to flange 506 using conductive epoxy, solder, solder bumps, sintering, and/or eutectic bonds.

According to an embodiment, transistor die 520 includes integrated capacitors 514, 515 (e.g., corresponding to two instances of capacitor 114, FIG. 1), two sets of parallel-coupled integrated spiral inductors 516, 517 (e.g., corresponding to two instances of inductive element 116, FIG. 1), two transistors 522, 523 (e.g., corresponding to two instances of transistor 120, FIG. 1), and two sets of parallel-coupled, integrated inductive elements 530, 531 (e.g., corresponding to two instances of inductive element 130, FIG. 1). Each transistor 522, 523 has a control terminal (e.g., a gate) and two current conducting terminals (e.g., a drain and a source). The control terminal of each transistor 522, 523 is coupled to an input lead 502, 503 through an input circuit 510, 511 (e.g., through bondwires 512, 513 and integrated inductors 516, 517 of the input circuits 510, 511). In addition, one current conducting terminal (e.g., the drain) of each transistor 522, 523 is coupled to an output lead 504, 505 through an output circuit 550, 551 (e.g., through integrated inductive elements 530, 531 and bondwires 532, 533 of the output circuits 550, 551). The other current conducting terminal (e.g., the source) is coupled to the flange 506 (e.g., to ground), in an embodiment.

More specifically, each input circuit 510, 511 (e.g., input circuit 110, FIG. 1) is coupled between an input lead 502, 503 (e.g., input lead 102, FIG. 1) and a control terminal of one of the transistors 522, 523 (e.g., transistor 120, FIG. 1). In the device 500 of FIG. 5, each input circuit 510, 511 includes two series-coupled inductive elements 512, 516 or 513, 517 (e.g., inductive elements 112, 116, FIG. 1) and a shunt capacitor 514, 515 (e.g., capacitor 114, FIG. 1). Each first series inductive element (e.g., inductive element 114, FIG. 1) is formed from a plurality of parallel, closely-spaced bondwires 512, 513 that is coupled between an input lead 502, 503 and an input-side conductive landing pad (not numbered) that is exposed at the top surface of the transistor die 520, in an embodiment. The input-side conductive landing pad corresponds to node 118, FIG. 1. Conversely, each second series inductive element (e.g., inductive element 116, FIG. 1) includes a set of parallel-coupled integrated spiral inductors 516, 517, where a first terminal of each spiral inductor 516, 517 is electrically coupled to an input-side conductive landing pad, and a second terminal of each spiral inductor 516, 517 is electrically coupled to the control terminal of a transistor 522, 523. A first terminal of each integrated capacitor 514, 515 also is electrically coupled to an input-side conductive landing pad (e.g., to node 118, FIG. 1). The second terminal of each integrated capacitor 514, 515 is coupled to the flange 506 (e.g., to ground). Capacitors 514, 515 may be, for example, MIM capacitors, or other types of capacitors. Although the input circuit capacitors 514, 515 and inductors 516, 517 are shown to be integrated with the transistor die 520, in the illustrated embodiment, the input circuit capacitors and inductors may be implemented as discrete capacitors (e.g., similar to capacitor 214, FIG. 2) and bondwire arrays (e.g., similar to bondwires 216, FIG. 2), respectively, in an alternate embodiment.

On the output side of device 500, an output circuit 550, 551 (e.g., output circuit 150, FIG. 1) is coupled between a first current conducting terminal (e.g., drain) of each transistor 522, 523 (e.g., transistor 120, FIG. 1) and an output lead 504, 505 (e.g., output lead 104, FIG. 1). In the device 500 of FIG. 5, each output circuit 550, 551 includes four inductive elements 530, 531, 532, 533, 534, 536 (e.g., inductive elements 130, 132, 134, 136, FIG. 1) and two capacitors 542, 544 (e.g., capacitors 142, 144, FIG. 1).

Inductive elements 530, 532 (e.g., a first instance of inductive elements 130, 132, FIG. 1) are series-coupled between the first current conducting terminal of transistor 522 and output lead 504, and inductive elements 531, 533 (e.g., a second instance of inductive elements 130, 132, FIG. 1) are series-coupled between the first current conducting terminal of transistor 523 and output lead 505. According to an embodiment, and referring also to FIG. 7, each of the first series inductive elements 530, 531 may include a conductive trace 730 (or transmission line) that is coupled to or exposed at the top surface of transistor die 520 (e.g., the conductive trace 730 is included in the top metal layer of the transistor die 520). In an alternate embodiment, each of the first series inductive elements 530, 531 may include one or more conductive traces that are at one or more metal layers lower than the top metal layer (e.g., at any metal layer from M1-M4 in a 5 metal layer device).

Although a majority of the inductance of each inductive element 531, 533 may be contributed by the conductive trace 730, each of the first series inductive elements 530, 531 actually may include a series-coupled sequence of conductive traces at one or more metal layers and conductive vias extending between the transistor 522, 523 and the metal layer(s). To be precise, each of the first series inductive elements 530, 531 has a first end 740 and a second end 741. The first end 740 coincides with the first current conducting terminal 726 of a transistor 522, 523, and the second end 741 coincides with a node 538, 539 (e.g., node 133, FIG. 1) to which the second series inductive element 532, 533 is coupled. According to an embodiment, node 741 is positioned closer to IPD 541 than the highest point of bondwires 534, although node 741 alternatively may be positioned directly under the highest point of bondwires 534 or farther from IPD 541 than the highest point of bondwires 534.

The first and second series inductive elements 530, 531, 532, 533 correspond to distinct segments of a two-segment series inductance. The first and second series inductive elements 530, 531, 532, 533 are "distinct" inductive segments in that they each have first and second ends that are electrically coupled to different sets of conductive features. For example, in the embodiment of FIG. 5, each of the first series inductive elements 530, 531 is electrically coupled between a first current conducting terminal of a transistor 522, 523 and a node 538, 539, and the second series inductive elements 532, 533 are distinct from the first series inductive elements 530, 531 because the second series inductive elements 532, 533 are electrically coupled between the node 538, 539 and an output lead 504, 505.

The total inductance of each inductive element 530, 531 is the sum of the inductances of its constituent parts between the first and second ends 740, 741. The node 538, 539 (or the second end 741) is coincident with a conductive landing pad for the second series inductive element 532, 533. In various embodiments, the node 538, 539 may coincide with the end of a conductive trace 730, as shown in FIGS. 5 and 7, or the node 538, 539 may coincide with another conductive feature that is suitable to function as a landing pad.

Figure 6:
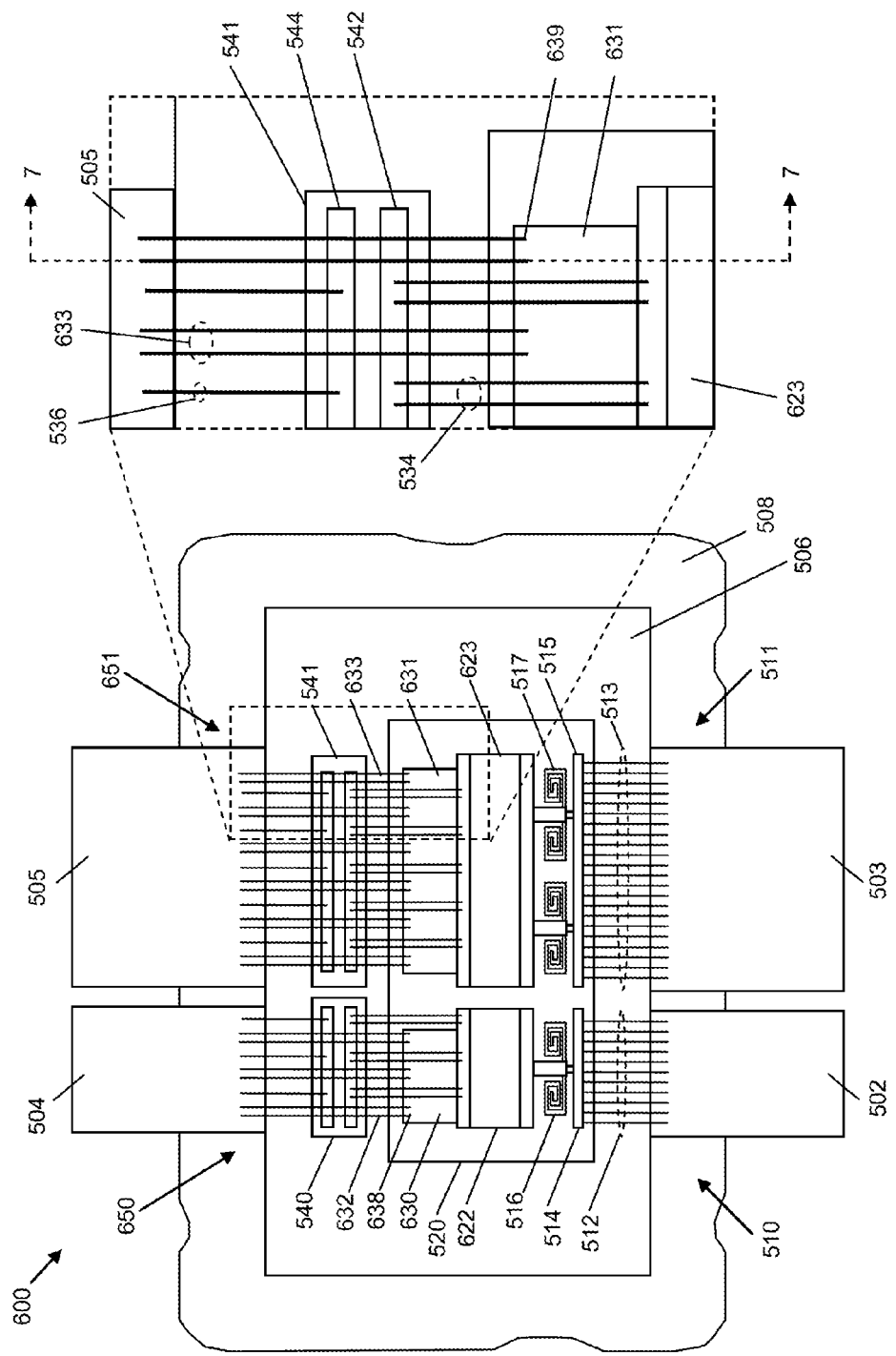
FIG. 6 is a top view of an example of a packaged RF amplifier device that embodies the circuit of FIG. 1, in accordance with yet another example embodiment.

In the embodiment of FIG. 5, each of the inductive elements 530, 531 includes a distinct trace 730 to which two bondwires of the second series inductive elements 532, 533 are coupled (i.e., at ends 741). More specifically, three of such traces 730 are electrically coupled to the first transistor 522, and six of such traces 730 are electrically coupled to the second transistor 523. Referring now to FIG. 6, the output circuits 650, 651 may be configured slightly differently, in another embodiment of a packaged RF amplifier device 600. For example, for each transistor 622, 623 in the transistor die 620, each of the inductive elements 630, 631 may include a single trace 730 to which all of the bondwires of each set of second series inductive elements 632, 633 are coupled (at a node 638, 639). In such an embodiment, the cross-section taken along line 7-7 in FIG. 6 may be substantially the same as the cross-section taken along line 7-7 in FIG. 5. Accordingly, FIG. 7 includes reference numbers associated with both FIG. 5 and FIG. 6. Further, as indicated by the common reference numbers, the various details and alternate embodiments discussed above with respect to FIG. 5 apply also to the embodiment of FIG. 6. In particular, each element 530, 531, 630, 631 may include a series of one or more traces and conductive vias, and the trace(s) may be at any metal layer(s).

Each of the second series inductive elements 532, 533, 632, 633 (e.g., series inductive element 132, FIG. 1) is formed from a plurality of parallel, closely-spaced bondwires, in an embodiment. For example, each of the second series inductive elements 532, 533, 632, 633 includes a plurality of bondwires coupled between an end of one of the first series inductive elements 530, 531, 630, 631 (e.g., end 741) and an output lead 504, 505. Essentially, inductive elements 530, 532, 630, 632 are coupled in series between the first current conducting terminal of transistor 522, 622 and output lead 504, and inductive elements 531, 533, 631, 633 are coupled in series between the first current conducting terminal of transistor 523, 623 and output lead 505. According to an embodiment, the bondwires of the second series inductive elements 532, 533, 632, 633 have a height, above the top surface of substrate 506, in a range of about 20 mils to about 60 mils, although the heights could be smaller or greater.

As with the previously-described embodiments, the capacitors 542, 544 of each output circuit 550, 551 are included in an IPD 540, 541, according to an embodiment. IPDs 540, 541 may be substantially similar to IPD 240, FIG. 2, except that they exclude landing pad 231 (FIG. 2). Further, in an embodiment in which low-pass matching circuit 143 is excluded, IPDs 540, 541 may exclude capacitor 544 (e.g., capacitor 144, FIG. 1).

Referring to the enlarged portions of devices 500, 600 in FIGS. 5 and 6 and also to FIG. 7, each shunt inductive element 534 (e.g., shunt inductive element 134, FIG. 1) includes a plurality of bondwires coupled between a conductive landing pad 526 that is electrically coupled to the first current conducting terminal 726 of a transistor 523, 623, and a conductive landing pad 742 that is exposed at the top surface of the IPD 541. According to an embodiment, the bondwires of the shunt inductive element 534 have a height, above the top surface of substrate 506, in a range of about 20 mils to about 60 mils, although the heights could be smaller or greater.

Within IPD 541, the conductive landing pad 742 is electrically coupled to a first terminal of shunt capacitor 542, where the first terminal of shunt capacitor 542 may be formed from the same conductive layer as landing pad 742, or from a portion a different conductive layer. The second terminal of capacitor 542 is electrically coupled to the bottom surface of IPD 541 with conductive TSVs.

A low-pass matching inductive element 536 (e.g., low-pass matching inductive element 136, FIG. 1) includes a plurality of bondwires coupled between the output lead 505 and a second conductive landing pad 744 that is exposed at the top surface of the IPD 541. Within IPD 541, the conductive landing pad 744 is electrically coupled to a first terminal of low-pass matching capacitor 544, where the first terminal of low-pass matching capacitor 544 may be formed from the same conductive layer as landing pad 744, or from a portion a different conductive layer. The second terminal of capacitor 544 is electrically coupled to the bottom surface of IPD 541 with conductive TSVs.

Figure 8:
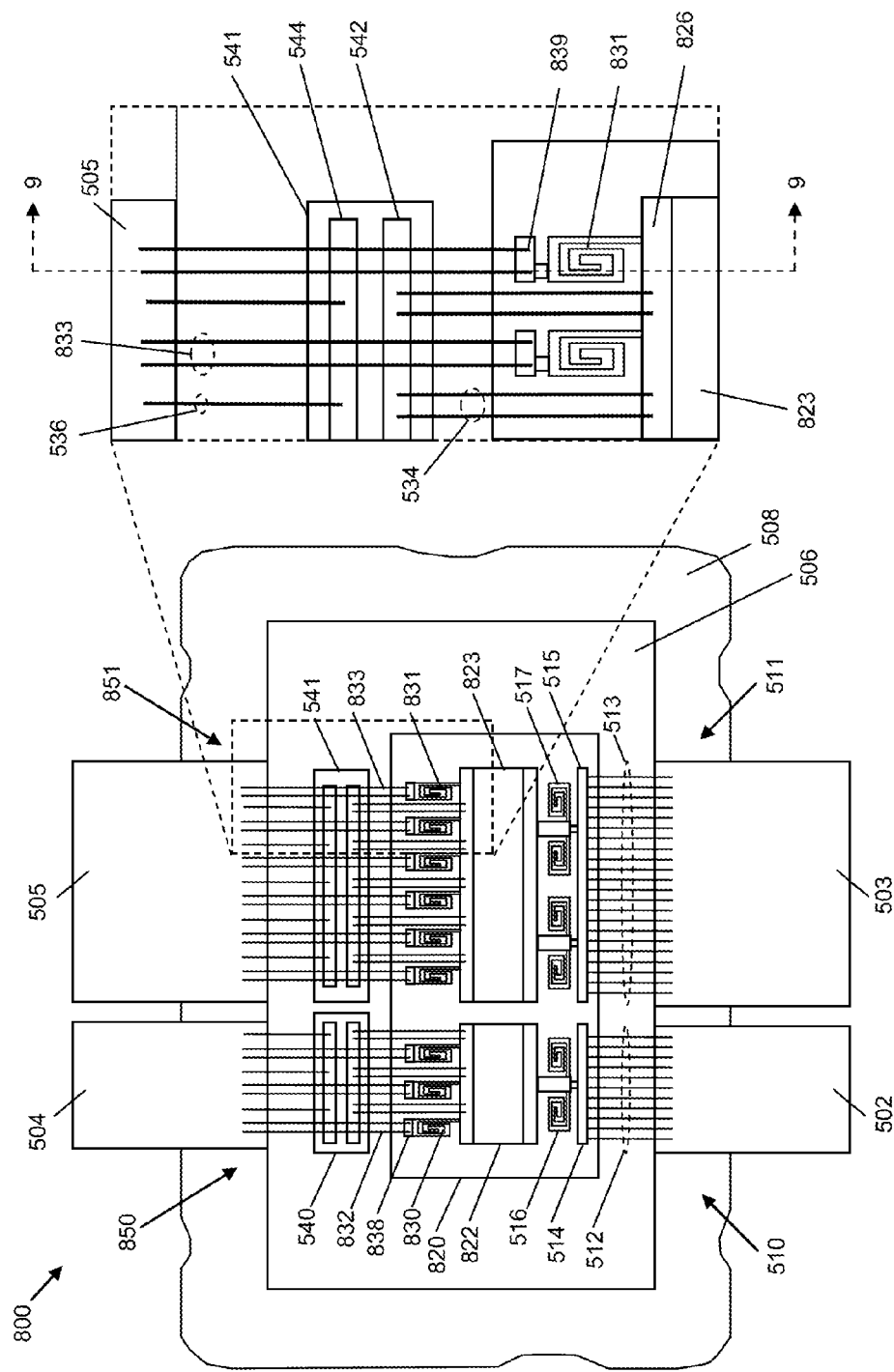
FIG. 8 is a top view of an example of a packaged RF amplifier device that embodies the circuit of FIG. 1, in accordance with yet another example embodiment.
Figure 9:
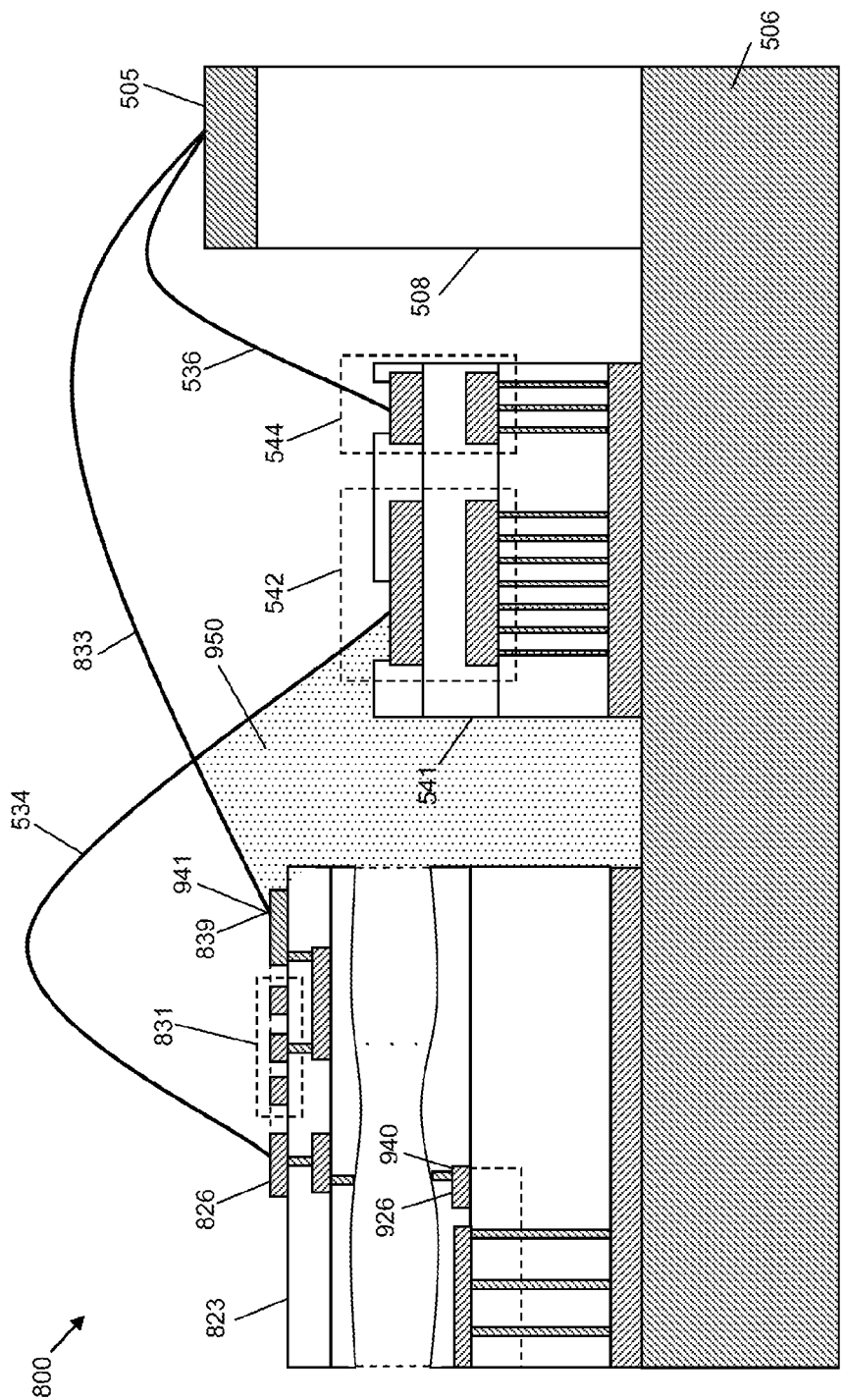
FIG. 9 is a cross-sectional, side view of the RF amplifier device of FIG. 8 along line 9-9.

In the embodiments discussed in conjunction with FIGS. 5-7, each first series inductive element (e.g., elements 530, 531, 630, 631) includes a conductive trace (e.g., trace 730) to provide a significant portion of the inductance of the series inductive element. In an alternate embodiment, each first series inductive element may include one or more integrated inductors. For example, FIG. 8 is a top view of an example of a packaged RF amplifier device 800 that embodies the circuit of FIG. 1, and that includes a plurality of integrated inductors 830, 831, in accordance with yet another example embodiment. For enhanced understanding, FIG. 8 should be viewed in conjunction with FIG. 9, which is a cross-sectional, side view of the semiconductor device 800 of FIG. 8 along line 9-9. More specifically, FIG. 9 is a cross-sectional view through a portion of transistor die 820, IPD 541, and output lead 505. Some of the features of device 800 are substantially similar to corresponding features of the devices 500, 600 of FIGS. 5-7. For brevity, where similarities exist, the features are not discussed in detail. Unless specified to the contrary, the details of various features discussed above are intended to be incorporated into the description of corresponding features discussed below. As indicated by the common reference numbers, the various details and alternate embodiments discussed above with respect to FIGS. 5 and 6 apply also to the embodiment of FIG. 8.

In RF amplifier device 800, the output circuits 850, 851 are configured differently than in the devices 500, 600 of FIGS. 5 and 6. For example, for each transistor 822, 823 in the transistor die 820, the first series inductive elements include a plurality of parallel-coupled, integrated inductors 830, 831. As used herein, the term "integrated inductor" means an inductor that is integrally formed in the same semiconductor die (e.g., die 820) as a transistor (e.g., transistor 823) to which the inductor is coupled.

Each integrated inductor 830, 831 includes a plurality of interconnected conductive turns, in an embodiment, and therefore may be considered to be an integrated spiral inductor. Although, in FIG. 9, integrated inductor 831 is shown to be implemented using one conductive layer, in other embodiments, integrated inductor 831 may be implemented using multiple conductive layers and conductive vias interconnecting the multiple conductive layers. Further, although integrated inductor 831 is shown to be formed from a top conductive layer, integrated inductor 831 may be formed from one or more layers below the top conductive layer.

According to an embodiment, first terminals of each integrated inductor 830, 831 are electrically coupled to a first current conducting terminal 926 of a transistor 822, 823, and second terminals of each integrated inductor 830, 831 are electrically coupled to a landing pad 839. The first and second terminals of the integrated inductors 830, 831 may be coupled to the first current conducting terminal 926 and landing pads 839 through various traces and conductive vias, as shown in FIG. 9.

Although a majority of the inductance of each first series inductive element may be contributed by the integrated inductor 830, 831, each of the first series inductive elements actually may include a series-coupled sequence of conductive traces at one or more metal layers, conductive vias extending between the transistor 822, 823 and the metal layer(s), and the integrated inductors 830, 831. To be precise, each of the first series inductive elements has a first end 940 and a second end 941. The first end 940 coincides with the first current conducting terminal 926 of a transistor 822, 823, and the second end 941 coincides with a node 838, 839 (e.g., node 133, FIG. 1) to which the second series inductive element 832, 833 is coupled. According to an embodiment, node 941 is positioned closer to IPD 541 than the highest point of bondwires 534, although node 941 alternatively may be positioned directly under the highest point of bondwires 534 or farther from IPD 541 than the highest point of bondwires 534.

The total inductance of each first series inductive element 830, 831 is the sum of the inductances of its constituent parts between the first and second ends 940, 941. The node 838, 839 (or the second end 941) is coincident with a conductive landing pad for the second series inductive element 832, 833. In various embodiments, the node 838, 839 may coincide with the end of a integrated inductor 830, 831, or the node 838, 839 may coincide with another conductive feature that is suitable to function as a landing pad, as shown in FIGS. 8 and 9.

Once again, each of the second series inductive elements 832, 833 (e.g., series inductive element 132, FIG. 1) is formed from a plurality of parallel, closely-spaced bondwires, in an embodiment. For example, each of the second series inductive elements 832, 833 includes a plurality of bondwires coupled between an end of one of the first series inductive elements 830, 831 (e.g., end 941) and an output lead 504, 505. Essentially, inductive elements 830, 832 are coupled in series between the first current conducting terminal of transistor 822 and output lead 504, and inductive elements 831, 833 are coupled in series between the first current conducting terminal of transistor 823 and output lead 505. According to an embodiment, the bondwires of the second series inductive elements 832, 833 have a height, above the top surface of substrate 506, in a range of about 20 mils to about 60 mils, although the heights could be smaller or greater.

Figure 10:
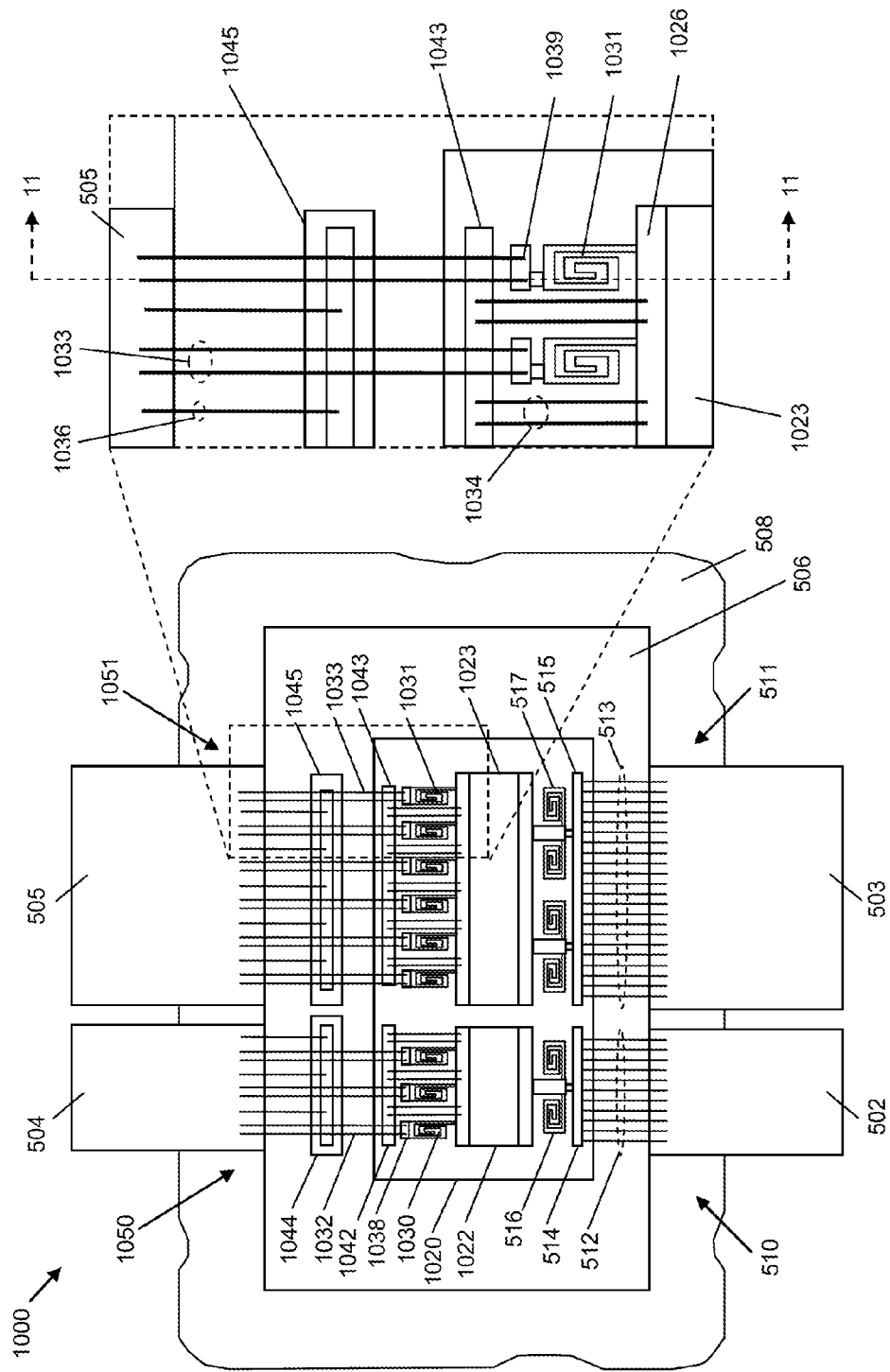
FIG. 10 is a top view of an example of a packaged RF amplifier device that embodies the circuit of FIG. 1, in accordance with yet another example embodiment.
Figure 11:
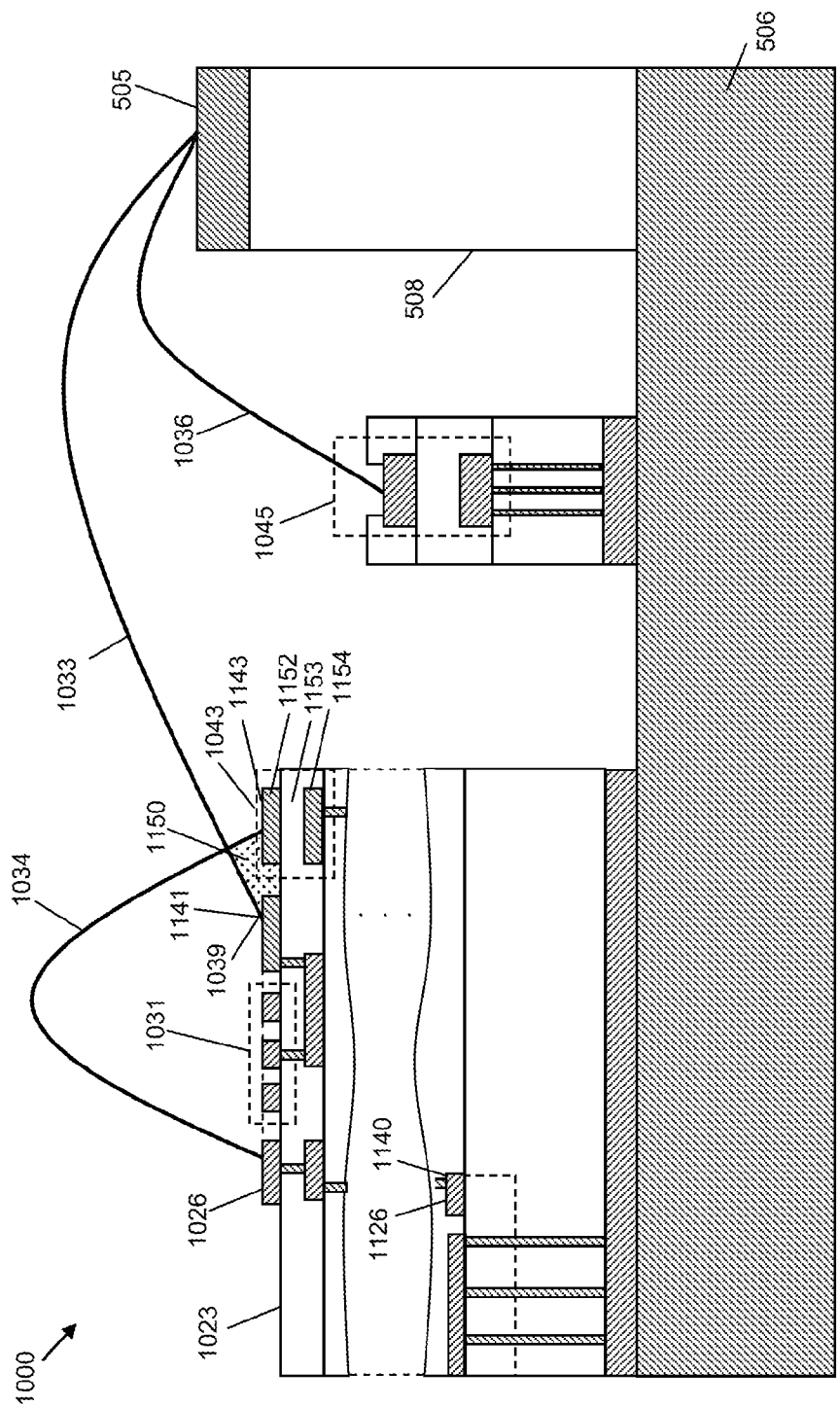
FIG. 11 is a cross-sectional, side view of the RF amplifier device of FIG. 10 along line 11-11.

In the embodiments illustrated in FIGS. 2-9, the shunt capacitor (e.g., capacitor 442, 542, FIGS. 4, 5, 9) is included in an IPD (e.g., IPD 240, 540, 541, FIGS. 4, 5), which is distinct from the transistor die (e.g., transistor die 220, 520, 620, 820, FIGS. 2, 5, 6, 8). In alternate embodiments, the shunt capacitor could be a discrete capacitor that is implemented in a type of device other than an IPD. In still other embodiments, the shunt capacitor may be integrated in the transistor die. For example, FIG. 10 is a top view of an example of a packaged RF amplifier device 1000 that embodies the circuit of FIG. 1, and that includes a plurality of integrated inductors 1030, 1031 and integrated shunt capacitors 1042, 1043, in accordance with yet another example embodiment. For enhanced understanding, FIG. 10 should be viewed in conjunction with FIG. 11, which is a cross-sectional, side view of the semiconductor device 1000 of FIG. 10 along line 11-11. More specifically, FIG. 11 is a cross-sectional view through a portion of transistor die 1020, capacitor 1044, and output lead 505. Some of the features of device 1000 are substantially similar to corresponding features of the devices 500, 600, 800 of FIGS. 5-9. For brevity, where similarities exist, the features are not discussed in detail. Unless specified to the contrary, the details of various features discussed above are intended to be incorporated into the description of corresponding features discussed below. As indicated by the common reference numbers, the various details and alternate embodiments discussed above with respect to FIGS. 5-9 apply also to the embodiment of FIG. 10.

In RF amplifier device 1000, the output circuits 1050, 1051 are configured differently than in the devices 500, 600, 800 of FIGS. 5, 6, and 8. For example, the transistor die 1020 includes an integrated shunt capacitor 1042, 1043 (e.g., two instances of shunt capacitor 142, FIG. 1) for each transistor 1022, 1023 in the transistor die 1020, rather than including the shunt capacitors in an IPD (e.g., as in the embodiments of FIGS. 2-9). As used herein, the term "integrated capacitor" means a capacitor that is integrally formed in the same semiconductor die (e.g., die 1020) as a transistor (e.g., transistor 1023) to which the capacitor is coupled.

According to an embodiment, each integrated shunt capacitor 1042, 1043 may be, for example, a MIM capacitor. More specifically, each shunt capacitor 1042, 1043 (e.g., shunt capacitor 142, FIG. 1) includes a first terminal 1152 and a second terminal 1154 that are separated by dielectric material 1153. The second terminal 1154 of each integrated shunt capacitor 1042, 1043 is electrically coupled to the bottom surface of the transistor die 520 through TSVs (not illustrated) and other conductive structures. Further, according to an embodiment, the first terminal 1152 of each integrated shunt capacitor 1042, 1043 is electrically coupled to a conductive landing pad 1143 that is exposed at the top surface of the transistor die 1022, 1023. The conductive landing pad 1143 may or may not be formed from the same conductive layer as the first terminal 1152.

Each shunt inductive element 1034 (e.g., shunt inductive element 134, FIG. 1) includes a plurality of bondwires coupled between a conductive landing pad 1026 that is electrically coupled to the first current conducting terminal 1126 of a transistor 1023, and the conductive landing pad 1143 that is coupled to the first terminal 1152 of capacitor 1043. According to an embodiment, the bondwires of the shunt inductive element 1034 have a height, above the top surface of substrate 506, in a range of about 20 mils to about 60 mils, although the heights could be smaller or greater.

As with the embodiment discussed in conjunction with FIGS. 8 and 9, the multi-segment series inductance circuit includes integrated spiral inductors 1030, 1031, which may be substantially similar to integrated spiral inductors 830, 831. In alternate embodiments, integrated inductors 1030, 1031 may be replaced by integrated traces (e.g., substantially similar to integrated traces, 530, 531 or 630, 631). In still other alternate embodiments, any of the integrated inductors 630, 631, 830, 831, 1030, 1031 may be replaced by a bondwire array that is electrically coupled between the first current carrying terminal of a transistor and a node (e.g., nodes 538, 539, 638, 639, 838, 839, 1038, 1039) to which the series bondwire arrays 532, 533, 632, 633, 832, 833, 1032, 1033) are coupled. Although, in FIG. 11, integrated inductor 1031 is shown to be implemented using one conductive layer, in other embodiments, integrated inductor 1031 may be implemented using multiple conductive layers and conductive vias interconnecting the multiple conductive layers. Further, although integrated inductor 1031 is shown to be formed from a top conductive layer, integrated inductor 1031 may be formed from one or more layers below the top conductive layer.

According to an embodiment, first terminals of each integrated inductor 1030, 1031 are electrically coupled to a first current conducting terminal 1126 of a transistor 1022, 1023, and second terminals of each integrated inductor 1030, 1031 are electrically coupled to a landing pad 1039. The first and second terminals of the integrated inductors 1030, 1031 may be coupled to the first current conducting terminal 1126 and landing pads 1039 through various traces and conductive vias, as shown in FIG. 11. As with the previously-described embodiments, each of the first series inductive elements actually may include a series-coupled sequence of conductive traces at one or more metal layers, conductive vias extending between the transistor 1022, 1023 and the metal layer(s), and the integrated inductors 1030, 1031. To be precise, each of the first series inductive elements has a first end 1140 and a second end 1141. The first end 1140 coincides with the first current conducting terminal 1126 of a transistor 1022, 1023, and the second end 1141 coincides with a node 1038, 1039 (e.g., node 133, FIG. 1) to which the second series inductive element 1032, 1033 is coupled. According to an embodiment, node 1141 is positioned closer to output lead 505 than the highest point of bondwires 1034, although node 1141 alternatively may be positioned directly under the highest point of bondwires 1034 or farther from output lead 505 than the highest point of bondwires 1134.

The total inductance of each first series inductive element 1030, 1031 is the sum of the inductances of its constituent parts between the first and second ends 1140, 1141. The node 1038, 1039 (or the second end 1141) is coincident with a conductive landing pad for the second series inductive element 1032, 1033. In various embodiments, the node 1038, 1039 may coincide with the end of a integrated inductor 1030, 1031, or the node 1038, 1039 may coincide with another conductive feature that is suitable to function as a landing pad, as shown in FIGS. 10 and 11.

Once again, each of the second series inductive elements 1032, 1033 (e.g., series inductive element 132, FIG. 1) is formed from a plurality of parallel, closely-spaced bondwires, in an embodiment. For example, each of the second series inductive elements 1032, 1033 includes a plurality of bondwires coupled between an end of one of the first series inductive elements 1030, 1031 (e.g., end 1141) and an output lead 504, 505. Essentially, inductive elements 1030, 1032 are coupled in series between the first current conducting terminal of transistor 1022 and output lead 504, and inductive elements 1031, 1033 are coupled in series between the first current conducting terminal of transistor 1023 and output lead 505. According to an embodiment, the bondwires of the second series inductive elements 1032, 1033 have a height, above the top surface of substrate 506, in a range of about 20 mils to about 60 mils, although the heights could be smaller or greater.

Finally, according to an embodiment, each low-pass matching capacitor 1044, 1045 (e.g., low-pass matching capacitor 144, FIG. 1) may be implemented as MIM capacitor (e.g., in an IPD) or as a discrete capacitor. A first terminal of each low-pass matching capacitor 1044, 1045 is electrically coupled to an output lead 504, 505 through bondwires 1036. In still other embodiments, the low-pass matching capacitors 1044, 1045 also may be integrated into the transistor die 1020. In an embodiment in which low-pass matching circuit 143 is excluded, the low-pass matching capacitors 1044, 1045 may be excluded.

Referring to each of FIGS. 7, 9, and 11, it is notable once again that the inductive coupling between series-coupled bondwire arrays 533, 633, 833, 1033 and shunt bondwires 534, 1034 is related to the size of the common area 750, 950, 1150 (indicated with shading) below the series bondwire arrays 533, 633, 833, 1033 and the shunt bondwire arrays 534, 1034. In this case, because inductive elements 531, 631, 831, 1031 have minimal heights, the net inductive coupling between inductive elements 531, 631, 831, 1031 and shunt bondwire arrays 534, 1034 may be minimal.

As discussed above, the relative placement of the inductive elements of the series and shunt circuits with respect to each other affects the net mutual inductance between those inductive elements. To further clarify this concept, FIGS. 12-14 are provided, which are charts indicating the effect on the net mutual inductance of the placement and configuration of the series and shunt inductive elements, in accordance with various embodiments. In FIGS. 12 and 13, the X axis (or horizontal axis) indicates the horizontal distance between the launching and landing points of the shunt and series inductive elements, and the Y axis (or vertical axis) indicates the bondwire height above the device substrate surface (or some other horizontal reference plane). For simplicity, the terms "trace" and "bondwire" may be used interchangeably below.

Figure 12:
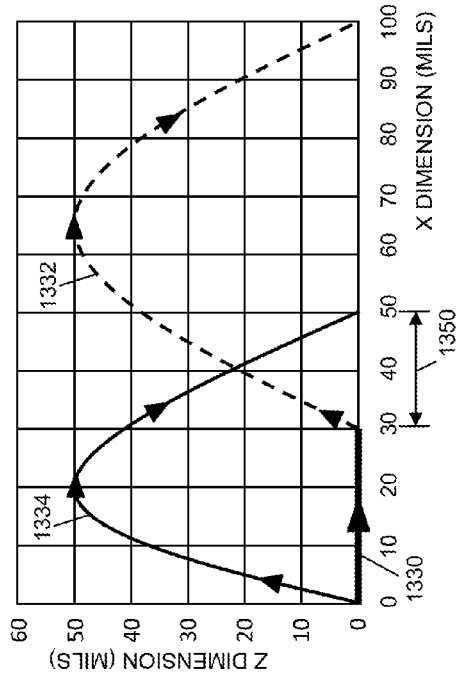
FIG. 12 is a chart indicating the effect on the net mutual inductance of the relative placement of the series and shunt inductive elements, in accordance with various embodiments.

FIG. 12 pertains to embodiments in which the first series inductance is implemented using a bondwire array (e.g., bondwires 230). In FIG. 12, a first series inductance is represented by trace 1230, and a second series inductance is represented by trace 1232. Finally, a shunt inductance is represented by trace 1234.

The shunt bondwire 1234 (e.g., bondwire 234) has a first end that is connected to a first point (at 0 mils on the X axis), and a second end that is connected to a second point (at 50 mils on the X axis). The first point corresponds to a landing pad on the transistor die (e.g., die 220) that is electrically connected to the first current conducting terminal of a transistor, and the second point corresponds to a landing pad that is electrically connected to the first terminal of a shunt capacitor (e.g., shunt capacitor 442). Although the shunt capacitor landing pad may be higher or lower than the transistor landing pad, they are indicated to be at the same height for simplicity. Further, although the landing pads may be at some height above the substrate surface, they are indicated to be at a height of 0 mils, also for simplicity.

Trace 1230 depicts an example configuration of a first segment of a multi-segment series circuit (e.g., first series bondwire 230), where the first segment bondwire 1230 has a height of about 14 mils, and a horizontal distance between its ends of 30 mils. The first end of the first series bondwire 1230 is connected to a first point (e.g., a landing pad connected to the first current conducting terminal), and the second end of the first series bondwire 1230 is connected to a second point (e.g., a landing pad corresponding to an intermediate node (e.g., node 231) in the series inductance circuit). The second series bondwire 1232 also is coupled to and launches from the node. The arrows along the bondwires 1230, 1234 in FIG. 12 indicate the direction of current flow along the bondwires 1230, 1234, during operation. Given the configuration of the series and shunt bondwires 1230, 1234, the area 1240 under bondwire 1230 indicates the magnitude of the positive inductive coupling between the bondwires 1230, 1234.

In the illustrated configuration, the second end of the first series bondwire 1230 is a distance 1250 of 20 mils closer to the transistor than the second end of the shunt bondwire 1234. In other words, there is a separation of 20 mils, in the horizontal direction, between the second ends of bondwires 1230 and 1234. In an embodiment in which the node (e.g., node 231) is moved even closer to the transistor (e.g., toward the 0 mil point), the area 1240 under the first series bondwire 1230 may be smaller. Conversely, in an embodiment in which the node (e.g., node 231) is moved further from the transistor (i.e., toward or beyond the second end of the shunt bondwire 1234), the area 1240 under the first series bondwire 1230 may be greater. This illustrates that one way of reducing or increasing the positive inductive coupling between bondwires 1230, 1234 is to increase or decrease, respectively, the separation distance between the second ends of bondwires 1230, 1234.

Figure 13:
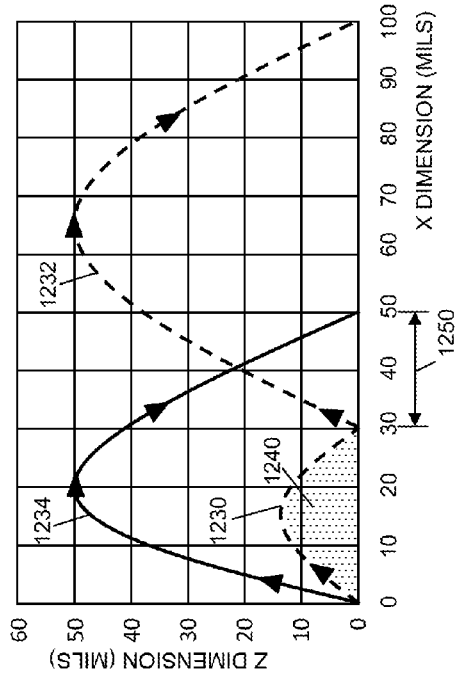
FIG. 13 is a chart indicating the effect on the net mutual inductance of the relative placement of the series and shunt inductive elements, in accordance with various other embodiments.

FIG. 13 pertains to embodiments in which the first series inductance is implemented using an integrated inductance (e.g., inductive elements 530, 531, 630, 631, 830, 831, 1030, 1031). In FIG. 13, the first series inductance is represented by trace 1330, and the second series inductance is represented by trace 1332. Finally, the shunt inductance is represented by trace 1334.

The integrated first series inductance 1330 has near zero height throughout its length. Accordingly, the integrated first series inductance 1330 may contribute zero or near zero inductive coupling to the net inductive coupling between the series and shunt elements 1330, 1332, 1334. In the illustrated embodiment, the integrated first series inductance 1330 extends from the 0 mil point to a node (e.g., node 538, 539, 638, 639, 838, 839, 1038, 1039) that underlies the shunt bondwire 1334 (e.g., to the 30 mil point along the X axis), and the second series bondwire 1332 also is coupled to and launches from the node. All other things being equal (e.g., bondwire heights, horizontal separation between the ends of the series and shunt bondwires, and so on), the net inductive coupling between the series and shunt elements may be significantly reduced in embodiments that include an integrated first series inductance, since the common area between the first series inductance 1330 and the shunt bondwire 1334 is essentially eliminated. In other embodiments, the integrated first series inductance 1330 may extend to a node that is the same distance from the transistor as the second end of the shunt bondwire 1334 (e.g., to the 50 mil point on the X axis), or the integrated first series inductance 1330 may extend to a node that is farther from the transistor than the second end of the shunt bondwire 1334 (e.g., to the 60 mil point on the X axis). In either of those embodiments, the net inductive coupling may be at or near zero, or may be negative.

Although particular horizontal distances between ends of the various bondwires are indicated in FIGS. 12 and 13, those distances are provided for example purposes, and the horizontal distances may be smaller or larger, in various embodiments. Further, although particular vertical heights to the tops of the various bondwires are indicated in FIGS. 12 and 13, those heights also are provided for example purposes, and the vertical heights may be smaller or larger, in various embodiments.

Figure 14:
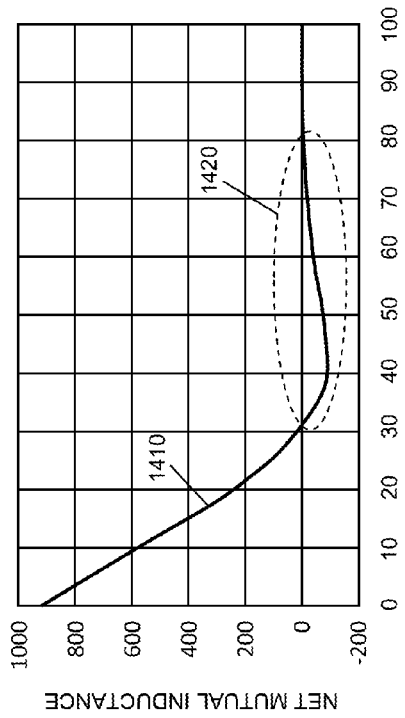
FIG. 14 is a chart indicating the effect on the net mutual inductance of the relative placement of the series and shunt inductive elements, in accordance with various embodiments.

FIG. 14 also pertains to embodiments in which the first series inductance is implemented using an integrated inductance. More specifically, FIG. 14 is a chart plotting net mutual inductance between the series and shunt bondwires as a function of separation between the first (or proximal) ends of the second series inductance and the shunt inductance, according to an embodiment. In FIG. 14, the X axis indicates the horizontal separation between the first end of the second series inductive element and the first end of the shunt inductive element, and the Y axis indicates the net mutual inductance between the shunt and series inductive elements. For example, the 30 mil point on the X axis indicates that the first ends of the second series inductive element and the shunt inductive element are 30 mils apart, which is the separation illustrated in FIG. 13.

Trace 1410 indicates that, as the separation between the first ends of the second series inductive element and the shunt inductive element increases from 0 mils, the initially-positive net mutual inductance decreases significantly. At about the 31 mil separation point, the net mutual inductance crosses the zero mutual inductance threshold, and in zone 1420, the net mutual inductance is negative. At some point (e.g., close to the point when the first end of the second series inductive element and the second end of the shunt inductive element are aligned), the negative net mutual inductance begins to increase, and eventually returns to net zero mutual inductance.

The previously described packaged RF amplifier devices 200, 500, 600, 800, 1000 may be incorporated into a larger electrical system by physically coupling the device to a printed circuit board (PCB), electrically connecting the input lead(s) to one or more signal sources, and electrically connecting the output lead(s) to a load. The PCB may further include one or more bias feeds (e.g., each with a length of lambda/4 or some other length) with proximal ends located close to the PCB connection(s) to the output lead and/or input lead. Other embodiments include devices with bias leads formed as integral portions of the device, and additional conductive features that couple the bias leads with the input and/or output circuits and/or transistors.

Figure 15:
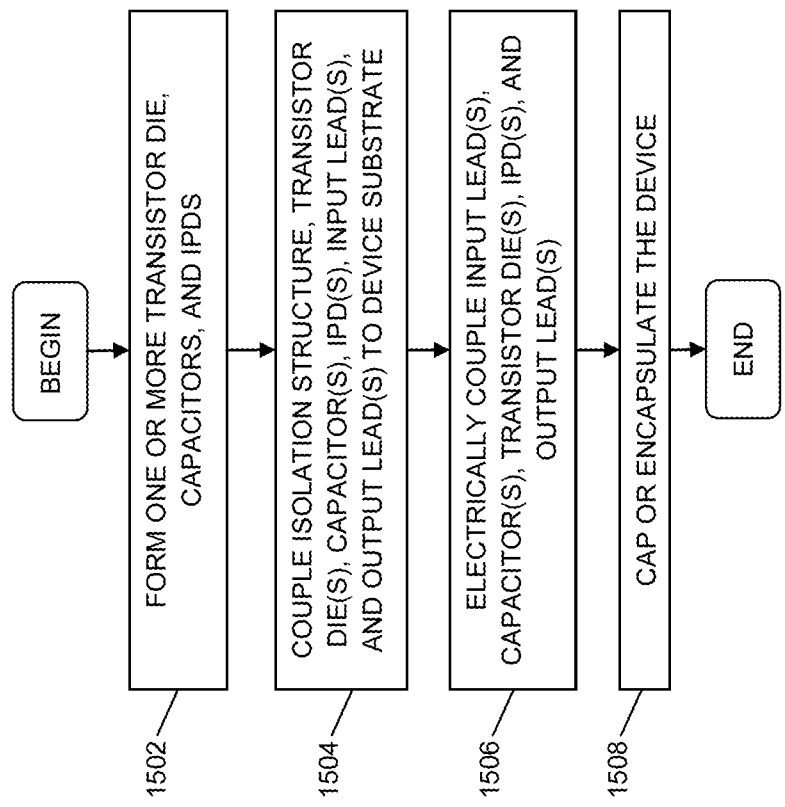
FIG. 15 is a flowchart of a method of manufacturing a packaged RF device, in accordance with an example embodiment.

FIG. 15 is a flowchart of a method of manufacturing a packaged RF device (e.g., device 200, 500, 600, 800, 1000, FIGS. 2, 5, 6, 8, 10) with a multi-segment series inductance in an output circuit, in accordance with an example embodiment. The method may begin, in block 1502, by forming various components of the device, including one or more transistor die (e.g., die 220, 520, 620, 820, 1020, FIGS. 2, 5, 6, 8, 10), one or more capacitors (e.g., capacitors 214, 1040, 1041, FIG. 2, 10), and one or more IPDs (e.g., IPDs 240, 540, 541, FIGS. 2, 5). In some embodiments, the transistor die (e.g., transistor die 520, 620, 820, 1020, FIGS. 5, 6, 8, 10) may include integrated inductive elements (e.g., inductive elements 530, 531, 630, 631, 830, 831, 1030, 1031, FIGS. 5, 6, 8, 10) that are electrically coupled to the first current conducting terminal(s) of transistor(s) within the transistor die. In other embodiments (e.g., the embodiment of FIG. 2), the integrated inductive elements may be excluded.

In block 1504, for an air cavity embodiment, an isolation structure (e.g., isolation structure 208, 508, FIGS. 2, 5) is coupled to a device substrate (e.g., flange 206, 506). In addition, the transistor die (e.g., die 220, 520, 620, 820, 1020, FIGS. 2, 5, 6, 8, 10), capacitor(s) (e.g., capacitors 214, 1040, 1041, FIG. 2, 10), and IPD(s) (e.g., IPDs 240, 540, 541, FIGS. 2, 5) are coupled to a portion of the top surface of the substrate that is exposed through an opening in the isolation structure (e.g., the active device area). Leads (e.g., input and output leads 202, 204, 502, 504, FIGS. 2, 5, and bias leads (if included)) are coupled to the top surface of the isolation structure (e.g., to metallization on the top surface of the isolation structure). For overmolded (e.g., encapsulated) device embodiments, the isolation structure may be excluded, and the substrate and leads may form portions of a leadframe.

In block 1506, the input lead(s), input capacitor(s), transistor die(s), output capacitor(s), IPD(s), and output lead(s)

are electrically coupled together. As discussed in detail previously, the electrical connections may be made using bondwires between the various device components and elements. According to an embodiment, the electrical connections in the output circuit include making electrical connections to form a multi-segment series inductance between a first current conducting terminal of each transistor and the output lead. For example, in the embodiment of FIG. 2, the multi-segment series inductance in each output circuit 250 includes a set of first bondwires 230 coupled in series with a set of second bondwires 232 between the first current conducting terminal of each transistor 220 and the output lead 204. In the embodiments of FIGS. 5-11, the multi-segment series inductance in each output circuit 550, 551, 650, 651, 850, 851, 1050, 1051 includes a first integrated inductive element 530, 531, 630, 631, 830, 831, 1030, 1031 coupled in series with a bondwire array 532, 533, 632, 633, 832, 833, 1032, 1033 between the first current conducting terminal of each transistor 522, 523, 622, 623, 822, 823, 1022, 1023 and an output lead 504, 505. Electrical connections in the output circuit also include bondwire arrays 534, 536, 1034, 1036 to capacitors 542, 544, 1042, 1044 in the shunt circuit(s).

Finally, in block 1508, the device is capped (e.g., with cap 310, FIG. 3) or encapsulated (e.g., with mold compound, not illustrated). The device may then be incorporated into a larger electrical system.

An embodiment of a packaged RF amplifier device includes a device substrate, an input lead coupled to the device substrate, an output lead coupled to the device substrate, and a transistor die coupled to a top surface of the device substrate. The transistor die includes a transistor having a control terminal, a first current carrying terminal, and a second current carrying terminal, and the control terminal is electrically coupled to the input lead. An output circuit is electrically coupled between the first current carrying terminal and the output lead. The output circuit includes a series circuit electrically coupled between the first current carrying terminal and the output lead, and the series circuit includes a first inductive element coupled between the first current carrying terminal and a node, and a second inductive element coupled between the node and the output lead. The second inductive element includes a first plurality of bondwires, and the first inductive element is selected from a second plurality of bondwires and an integrated inductance.

An embodiment of a method of manufacturing a packaged RF amplifier device includes coupling a transistor die to a top surface of a device substrate, where the transistor die includes a transistor having a control terminal, a first current carrying terminal, and a second current carrying terminal. The method further includes electrically coupling the control terminal of the transistor to an input lead, and electrically coupling an output circuit between the first current carrying terminal of the transistor and an output lead. The output circuit includes a series circuit electrically coupled between the first current carrying terminal and the output lead, and the series circuit includes a first inductive element coupled between the first current carrying terminal and a node, and a second inductive element coupled between the node and the output lead. The second inductive element includes a first plurality of bondwires, and the first inductive element is selected from a second plurality of bondwires and an integrated inductance.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A packaged radio frequency (RF) amplifier device comprising:
    a device substrate;
    an input lead coupled to the device substrate;
    an output lead coupled to the device substrate;
    a transistor die coupled to a top surface of the device substrate, the transistor die including a transistor having a control terminal, a first current carrying terminal, and a second current carrying terminal, wherein the control terminal is electrically coupled to the input lead; and an output circuit electrically coupled between the first current carrying terminal and the output lead, wherein the output circuit includes a series circuit electrically coupled between the first current carrying terminal and the output lead, wherein the series circuit includes a first inductive element coupled between the first current carrying terminal and a node, and a second inductive element coupled between the node and the output lead, wherein the first inductive element includes an integrated inductance, and the second inductive element includes a first plurality of bondwires.

2. The device of claim 1, wherein the integrated inductance includes a plurality of conductive traces, wherein a first end of each conductive trace is electrically coupled to the first current carrying terminal, and a second end of each conductive trace is electrically coupled to a subset of the first plurality of bondwires.

3. The device of claim 1, wherein the integrated inductance includes a conductive trace, wherein a first end of the conductive trace is electrically coupled to the first current carrying terminal, and a second end of the conductive trace is electrically coupled to the first plurality of bondwires.

4. The device of claim 1, wherein the integrated inductance includes a plurality of integrated spiral inductors, wherein a first terminal of each integrated spiral inductor is electrically coupled to the first current carrying terminal, and a second terminal of each integrated spiral inductor is electrically coupled to a subset of the first plurality of bondwires.

5. The device of claim 1, wherein the output circuit further comprises:
a first shunt circuit electrically coupled between the first current carrying terminal and the device substrate.

6. The device of claim 5, wherein the first shunt circuit comprises:
a first capacitor having a first terminal and a second terminal, wherein the second terminal is electrically coupled to the device substrate; and
a second plurality of bondwires coupled between the first current carrying terminal and the first terminal of the first capacitor.

7. A packaged radio frequency (RF) amplifier device comprising:
a device substrate;
an input lead coupled to the device substrate;
an output lead coupled to the device substrate;
a transistor die coupled to a top surface of the device substrate, the transistor die including a transistor having a control terminal, a first current carrying terminal, and a second current carrying terminal, wherein the control terminal is electrically coupled to the input lead;
an output circuit electrically coupled between the first current carrying terminal and the output lead, wherein the output circuit includes a series circuit electrically coupled between the first current carrying terminal and the output lead, wherein the series circuit includes a first inductive element coupled between the first current carrying terminal and a node, and a second inductive element coupled between the node and the output lead, wherein the first inductive element includes a first plurality of bondwires, and the second inductive element includes a second plurality of bondwires;
a shunt circuit electrically coupled between the first current carrying terminal and the device substrate, wherein the shunt circuit includes
a first capacitor having a first terminal and a second terminal, wherein the second terminal is electrically coupled to the device substrate, wherein the first capacitor forms a portion of an integrated passive device, and the integrated passive device further includes a landing pad, wherein the first inductive element is the first plurality of bondwires, and the node is the landing pad, and
a third plurality of bondwires coupled between the first current carrying terminal and the first terminal of the first capacitor.

8. The device of claim 6, wherein the first capacitor is integrated within the transistor die.

9. A packaged radio frequency (RF) amplifier device comprising:
a device substrate;
an input lead coupled to the device substrate;
an output lead coupled to the device substrate;
a transistor die coupled to a top surface of the device substrate, the transistor die including a transistor having a control terminal, a first current carrying terminal, and a second current carrying terminal, wherein the control terminal is electrically coupled to the input lead;
an output circuit electrically coupled between the first current carrying terminal and the output lead, wherein the output circuit includes a series circuit electrically coupled between the first current carrying terminal and the output lead, wherein the series circuit includes a first inductive element coupled between the first current carrying terminal and a node, and a second inductive element coupled between the node and the output lead, wherein the first inductive element includes a first plurality of bondwires, and the second inductive element includes a second plurality of bondwires;
a shunt circuit electrically coupled between the first current carrying terminal and the device substrate, wherein the shunt circuit includes
a first capacitor having a first terminal and a second terminal, wherein the second terminal is electrically coupled to the device substrate, and
a third plurality of bondwires coupled between the first current carrying terminal and the first terminal of the first capacitor, wherein a height of the third plurality of bondwires above the device substrate is significantly greater than a height of the first plurality of bondwires above the device substrate.

10. The device of claim 6, wherein the output circuit further comprises:
a second shunt circuit electrically coupled between the output lead and the device substrate, wherein the second shunt circuit comprises:
a second capacitor having a first terminal and a second terminal, wherein the second terminal is electrically coupled to the device substrate; and
a third plurality of bondwires coupled between the output lead and the first terminal of the second capacitor.

11. The device of claim 10, wherein the first and second capacitors form portions of an integrated passive device that is coupled to the device substrate.

12. A method of manufacturing a packaged radio frequency (RF) amplifier device, the method comprising the steps of:
coupling a transistor die to a top surface of a device substrate, the transistor die including a transistor having a control terminal, a first current carrying terminal, and a second current carrying terminal;

electrically coupling the control terminal of the transistor to an input lead; and electrically coupling an output circuit between the first current carrying terminal of the transistor and an output lead, wherein the output circuit includes a series circuit electrically coupled between the first current carrying terminal and the output lead, wherein the series circuit includes a first inductive element coupled between the first current carrying terminal and a node, and a second inductive element coupled between the node and the output lead, wherein the first inductive element includes an integrated inductance, and the second inductive element includes a first plurality of bondwires.

13. The method of claim 12, wherein the method further comprises:
forming the transistor die to include the integrated inductance, wherein the integrated inductance includes a plurality of conductive traces, wherein a first end of each conductive trace is electrically coupled to the first current carrying terminal; and
wherein electrically coupling the output circuit comprises electrically coupling a second end of each conductive trace to a subset of the first plurality of bondwires.

14. The method of claim 12, wherein the method further comprises:
forming the transistor die to include the integrated inductance, wherein the integrated inductance includes a conductive trace, wherein a first end of the conductive trace is electrically coupled to the first current carrying terminal; and
wherein electrically coupling the output circuit comprises electrically coupling a second end of the conductive trace to the first plurality of bondwires.

15. The method of claim 12, wherein the method further comprises:
forming the transistor die to include the integrated inductance, wherein the integrated inductance includes a plurality of integrated spiral inductors, wherein a first terminal of each integrated spiral inductor is electrically coupled to the first current carrying terminal; and
wherein electrically coupling the output circuit comprises electrically coupling a second terminal of each integrated spiral inductor to the first plurality of bondwires.

16. The method of claim 12, further comprising:
electrically coupling a first shunt circuit between the first current carrying terminal and the device substrate.

17. The method of claim 16, wherein electrically coupling the first shunt circuit comprises:
coupling a first capacitor to the device substrate, wherein the first capacitor has a first terminal and a second terminal, wherein the second terminal is electrically coupled to the device substrate; and
electrically coupling a second plurality of bondwires between the first current carrying terminal and the first terminal of the first capacitor.

18. A method of manufacturing a packaged radio frequency (RF) amplifier device, the method comprising the steps of:
coupling a transistor die to a top surface of a device substrate, the transistor die including a transistor having a control terminal, a first current carrying terminal, and a second current carrying terminal;
electrically coupling the control terminal of the transistor to an input lead;
electrically coupling a shunt circuit between the first current carrying terminal and the device substrate by
coupling a first capacitor to the device substrate, wherein the first capacitor has a first terminal and a second terminal, wherein the second terminal is electrically coupled to the device substrate, and wherein the first capacitor forms a portion of an integrated passive device, and the integrated passive device further includes a landing pad, and
electrically coupling a first plurality of bondwires between the first current carrying terminal and the first terminal of the first capacitor; and
electrically coupling an output circuit between the first current carrying terminal of the transistor and an output lead, wherein the output circuit includes a series circuit electrically coupled between the first current carrying terminal and the output lead, wherein the series circuit includes a first inductive element coupled between the first current carrying terminal and a node, and a second inductive element coupled between the node and the output lead, wherein the first inductive element includes a second plurality of bondwires, and the second inductive element includes a third plurality of bondwires, wherein the node is the landing pad, and wherein electrically coupling the output circuit comprises electrically coupling the second plurality of bondwires between the transistor die and the landing pad.

19. The method of claim 17, wherein the first capacitor is integrated with the transistor die.

20. A method of manufacturing a packaged radio frequency (RF) amplifier device, the method comprising the steps of:
coupling a transistor die to a top surface of a device substrate, the transistor die including a transistor having a control terminal, a first current carrying terminal, and a second current carrying terminal;
electrically coupling the control terminal of the transistor to an input lead;
electrically coupling an output circuit between the first current carrying terminal of the transistor and an output lead, wherein the output circuit includes a series circuit electrically coupled between the first current carrying terminal and the output lead, wherein the series circuit includes a first inductive element coupled between the first current carrying terminal and a node, and a second inductive element coupled between the node and the output lead, wherein the first inductive element includes a first plurality of bondwires, and the second inductive element includes a second plurality of bondwires; and
electrically coupling a shunt circuit between the first current carrying terminal and the device substrate by
coupling a first capacitor to the device substrate, wherein the first capacitor has a first terminal and a second terminal, wherein the second terminal is electrically coupled to the device substrate, and
electrically coupling a third plurality of bondwires between the first current carrying terminal and the first terminal of the first capacitor, wherein a height of the third plurality of bondwires above the device substrate is significantly greater than a height of the first plurality of bondwires above the device substrate.

21. The method of claim 17, further comprising:
electrically coupling a second shunt circuit between the output lead and the device substrate, wherein the second shunt circuit includes a second capacitor having a first terminal and a second terminal, wherein the second terminal is electrically coupled to the device substrate, and a third plurality of bondwires coupled between the output lead and the first terminal of the second capacitor.

* * * * *